United States Patent
Yamamoto et al.

(10) Patent No.: US 11,171,257 B2
(45) Date of Patent: Nov. 9, 2021

(54) SEMICONDUCTOR LIGHT-EMITTING DEVICE AND METHOD OF MANUFACTURING THE SAME

(71) Applicant: DOWA Electronics Materials Co., Ltd., Tokyo (JP)

(72) Inventors: Jumpei Yamamoto, Akita (JP); Tetsuya Ikuta, Akita (JP)

(73) Assignee: DOWA Electronics Materials Co., Ltd., Tokyo (JP)

(*) Notice: Subject to any disclaimer, the term of this patent is extended or adjusted under 35 U.S.C. 154(b) by 0 days.

(21) Appl. No.: 16/471,083

(22) PCT Filed: Dec. 15, 2017

(86) PCT No.: PCT/JP2017/045194
§ 371 (c)(1),
(2) Date: Jun. 19, 2019

(87) PCT Pub. No.: WO2018/116995
PCT Pub. Date: Jun. 28, 2018

(65) Prior Publication Data
US 2020/0020828 A1    Jan. 16, 2020

(30) Foreign Application Priority Data

Dec. 20, 2016    (JP) .............................. JP2016-246130

(51) Int. Cl.
*H01L 33/22*        (2010.01)
*H01L 33/00*        (2010.01)
(Continued)

(52) U.S. Cl.
CPC .......... *H01L 33/22* (2013.01); *H01L 33/0062* (2013.01); *H01L 33/10* (2013.01); *H01L 33/30* (2013.01); *H01L 33/40* (2013.01)

(58) Field of Classification Search
CPC ..... H01L 33/22; H01L 33/0062; H01L 33/10; H01L 33/30; H01L 2933/0016;
(Continued)

(56) References Cited

U.S. PATENT DOCUMENTS 4,953,170 A      8/1990  Logan et al.
2005/0221527 A1* 10/2005 Yeh .......................... H01L 33/22
                                                                438/46
(Continued)

FOREIGN PATENT DOCUMENTS

CN          101515614 A      8/2009
CN          104137280 A      11/2014
(Continued)

OTHER PUBLICATIONS

Feb. 6, 2018, International Search Report issued in the International Patent Application No. PCT/JP2017/045194.

(Continued)

*Primary Examiner* — Cuong B Nguyen
(74) *Attorney, Agent, or Firm* — Kenja IP Law PC

(57) ABSTRACT

Provided is a semiconductor light-emitting device which can mitigate a multipeak in an emission spectrum in a bonding-type semiconductor light-emitting device having an InP cladding layer. The semiconductor light-emitting device of the present disclosure includes a first conductive type InP cladding layer, a semiconductor light-emitting layer, and a second conductive type InP cladding layer provided sequentially over a conductive support substrate, the second conductive type InP cladding layer being on a light extraction side, and the semiconductor light-emitting device further includes a metal reflective layer, between the conductive support substrate and the first conductive type InP cladding layer, for reflecting light emitted from the semiconductor (Continued)

light-emitting layer; and a plurality of recesses provided in a surface of the second conductive type InP cladding layer.

15 Claims, 17 Drawing Sheets

(51) Int. Cl.
*H01L 33/10* (2010.01)
*H01L 33/30* (2010.01)
*H01L 33/40* (2010.01)

(58) Field of Classification Search
CPC ............. H01L 2933/0058; H01L 33/20; H01L 2933/0083; H01L 33/0093; H01L 33/405; H01L 33/40; H01L 33/0004–648
See application file for complete search history.

(56) References Cited

U.S. PATENT DOCUMENTS

| | | | | |
|---|---|---|---|---|
| 2007/0194325 | A1* | 8/2007 | Sung | H01L 33/0093 257/79 |
| 2007/0241322 | A1 | 10/2007 | Bour et al. | |
| 2012/0037949 | A1* | 2/2012 | Jeong | H01L 33/405 257/99 |
| 2016/0233376 | A1* | 8/2016 | Lin | H01L 33/26 |

FOREIGN PATENT DOCUMENTS

| | | |
|---|---|---|
| JP | S7184277 A | 11/1982 |
| JP | S6112070 A | 1/1986 |
| JP | H0451569 A | 2/1992 |
| JP | H06237042 A | 8/1994 |
| JP | H07147454 A | 6/1995 |
| JP | H10242511 A | 9/1998 |
| JP | 2005259910 A | 9/2005 |
| JP | 2005317663 A | 11/2005 |
| JP | 2008135667 A | 6/2008 |
| JP | 2009206265 A | 9/2009 |
| JP | 2010118431 A | 5/2010 |
| JP | 2010278278 A | 12/2010 |
| JP | 2011199111 A | 10/2011 |
| JP | 2012033521 A | 2/2012 |
| JP | 2012084727 A | 4/2012 |
| JP | 2012231000 A | 11/2012 |
| JP | 2013030606 A | 2/2013 |
| JP | 2013171948 A | 9/2013 |
| JP | 2014195055 A | 10/2014 |
| TW | 200605398 A | 2/2006 |

OTHER PUBLICATIONS

Feb. 6, 2018, Notice of Reasons for Refusal issued by the Japan Patent Office in the corresponding Japanese Patent Application No. 2016-246130.
Mar. 8, 2019, Office Action issued by Taiwan Intellectual Property Office in the corresponding Taiwanese Patent Application No. 106144917.
May 7, 2019, Decision of Refusal issued by the Japan Patent Office in the corresponding Japanese Patent Application No. 2016-246130.
Sep. 4, 2018, Notice of Reasons for Refusal issued by the Japan Patent Office in the corresponding Japanese Patent Application No. 2016-246130.
Jun. 25, 2019, International Preliminary Report on Patentability issued in the International Patent Application No. PCT/JP2017/045194.
Oct. 26, 2020, Notice of Reasons for Revocation issued by the Japan Patent Office in the corresponding Japanese Patent Patent No. 6608352.
R. Klockenbrink et al., Wet Chemical Etching of Alignment V-Grooves in (100) InP through Titanium or In0.53Ga0.47As Masks, Journal of the Electrochemical Society, Jun. 1994, pp. 1594-1599, vol. 141, No. 6.
Sadao Adachi et al., Chemical Etching Characteristics of (001) InP, Journal of the Electrochemical Society, Jun. 1981, pp. 1342-1349, vol. 128, No. 6.
Jul. 29, 2021, Office Action issued by the China National Intellectual Property Administration in the corresponding Chinese Patent Application No. 201780078274.4.

* cited by examiner

Step 4A

Step 4B

Step 8A

Step 8B

Step 8C

Step 8D

Step 9A

Step 9B

Step 9C

⟨011⟩ Orientation

⟨011⟩ Orientation

<011>Orientation

<011> Orientation

SEMICONDUCTOR LIGHT-EMITTING DEVICE AND METHOD OF MANUFACTURING THE SAME

TECHNICAL FIELD

The present disclosure relates to a semiconductor light-emitting device and a method of manufacturing the same, particularly to a semiconductor light-emitting device of infrared emissions.

BACKGROUND

Conventionally, semiconductor light-emitting devices are known which emit light with a wavelength of 750 nm or more in the infrared region. For example, semiconductor light-emitting device of infrared emissions are widely used in the applications such as sensors, gas analysis, and surveillance cameras.

When emission wavelengths of such a semiconductor light-emitting device are 1000 nm to 2200 nm in a near infrared region, an InGaAsP-based III-V semiconductor containing In and P in a light-emitting layer is usually used. Conventionally, when an InGaAsP-based III-V semiconductor layer such as an InP layer is epitaxially grown, an InP substrate is used as a growth substrate so that the growth substrate and the InGaAsP-based III-V semiconductor layer containing In and P are lattice matched.

For example, JP H07-147454 A (PTL 1) discloses a semiconductor laser emitting at wavelengths in the 1.3 μm range. This semiconductor laser has a strained multiple quantum well active layer formed on an n-InP substrate, and the strained multiple quantum well active layer has a structure in which InGaAsP strained quantum wells and InGaAsP barrier layers are alternately stacked.

Further, JP H06-237042 A (PTL 2) discloses that InGaAsP barrier layers having the same lattice constant as that of an InP substrate, and quantum well layers including strained quantum well layers each formed from an $In_{0.3}Ga_{0.7}As$ layer having a smaller lattice constant than the InP substrate and lattice strain compensation layers each made of InAs having a larger lattice constant than the InP substrate are provided on the InP substrate.

CITATION LIST

Patent Literature

PTL 1: JP H07-147454 A
PTL 2: JP H06-237042 A

SUMMARY

Technical Problem

In the techniques described in PTL1 and PTL2, an InP substrate serving as a growth substrate is used as a support substrate for a semiconductor light-emitting device. This is because InP substrates are transparent to light in the near-infrared region and thus cause no obstruction to light extractions.

In a light-emitting device based on a III-V compound semiconductor containing In and P provided on an InP substrate, however, increasing the light emission output power is limited due to concentration of current paths directly under the electrode.

Recent diversified applications of LEDs have also created strong demands for higher output powers of semiconductor light-emitting devices emitting longer-wavelength light, such as infrared light. We have attempted to fabricate a bonding-type semiconductor light-emitting device by forming a semiconductor stack having an InP cladding layer formed on a growth substrate, then bonding a support substrate and the growth substrate to each other, and removing the growth substrate. Using bonding-type semiconductor light-emitting devices, it is possible to provide a reflective metal layer between a support substrate and a light-emitting layer, as well as a layer for controlling current paths.

We have confirmed that such bonding-type semiconductor light-emitting device significantly improved external extraction efficiencies. These bonding-type semiconductor light-emitting devices, however, have a lot of light emission peaks in an emission spectrum other than the light emission peak of the central emission wavelength (hereinafter, such peaks are referred to as "multipeak"). Note that a non-bonding-type semiconductor light-emitting device according to prior art generally has only a single peak in the emission spectrum. A semiconductor light-emitting device that emits multipeak irradiation light as described above may be disadvantageous when used for sensors or other applications.

Therefore, it is an object of the present disclosure to provide a semiconductor light-emitting device and a method of manufacturing the same which can mitigate a multipeak in an emission spectrum in a bonding-type semiconductor light-emitting device having an InP cladding layer.

Solution to Problem

We have made strenuously efforts on solutions to the aforementioned issues. When infrared light radiated from a light-emitting layer is incident on an InP cladding layer on the light extraction side, the index of the refraction of InP is about 3.2 to the infrared light. Therefore, it is regarded that most of incident light other than the orthogonal incident light does not pass through the InP cladding layer and returns to the semiconductor layer due to the total reflection and reflections at the interface of the InP cladding layer. On the other hand, in a bonding-type semiconductor light-emitting device having a reflective metal layer, infrared light radiated from a light-emitting layer is reflected by the reflective metal layer and the reflected light by the reflection is incident on an InP cladding layer as described above. Here, a semiconductor layer in a bonding-type semiconductor light-emitting device having an InP cladding layer has a thickness of several micrometers at most, which is within the coherence length of infrared light and is hence susceptible to interference. Note that the coherence length of light having a central emission wavelength of 1300 nm and a half band width of 100 nm is 16.9 μm, and the coherence length of light having an central emission wavelength 1460 nm and a half band width of 100 nm is 21.3 μm. We considered that an observed multipeak in an emission spectrum was induced by interference between reflected light in an InP cladding layer and light reflected by a reflective metal layer. Therefore, we gained an idea that roughening a surface of an InP cladding layer reduces the ratio of the total reflection light at the interface of the InP cladding layer. Then we have found that provision of a plurality of recesses in a surface of the InP cladding layer mitigated a multipeak, thereby completing the present disclosure.

In other words, the subject matter of the present disclosure is as follows:

(1) A semiconductor light-emitting device comprising a first conductive type InP cladding layer, a semiconductor light-emitting layer, and a second conductive type InP cladding layer provided sequentially over a conductive support substrate, the second conductive type InP cladding layer being on a light extraction side, the semiconductor light-emitting device further comprising:

a metal reflective layer, between the conductive support substrate and the first conductive type InP cladding layer, for reflecting light emitted from the semiconductor light-emitting layer; and a plurality of recesses provided in a surface of the second conductive type InP cladding layer.

(2) The semiconductor light-emitting device according to the aforementioned (1), wherein bottoms of the recesses are oriented along a <011> orientation.

(3) The semiconductor light-emitting device according to the aforementioned (2), wherein the recesses are formed in ellipses in a plan view from the light extraction side, and long axes of the ellipses are oriented along the bottoms of the recesses.

(4) The semiconductor light-emitting device according to the aforementioned (2), wherein widths of the recesses vary periodically along a direction of central axes of the recesses in a plan view from the light extraction side, and the direction of the central axes is oriented along the bottoms of the recesses.

(5) The semiconductor light-emitting device according any one of the aforementioned (1) to (4), wherein the plurality of recesses are regularly arranged.

(6) The semiconductor light-emitting device according any one of the aforementioned (1) to (5), wherein space between adjacent recesses on the surface of the second conductive type InP cladding layer is flat.

(7) A method of manufacturing a semiconductor light-emitting device, comprising:

a semiconductor layer formation step of forming a III-V compound semiconductor etch stop layer containing In, Ga, and As, a second conductive type InP cladding layer, a semiconductor light-emitting layer, and a first conductive type InP cladding layer sequentially above a growth substrate;

a metal reflective layer formation step of forming a metal reflective layer on the first conductive type InP cladding layer for reflecting light emitted from the semiconductor light-emitting layer;

a bonding step of bonding a conductive support substrate having a surface provided with a metal bonding layer to the metal reflective layer having the metal bonding layer interposed therebetween;

a substrate removal step of removing the growth substrate; and a surface roughening step of forming a plurality of recesses in a surface of the second conductive type InP cladding layer, after the substrate removal step.

(8) The method of manufacturing a semiconductor light-emitting device according to the aforementioned (7), wherein bottoms of the recesses are made to be oriented along a <011> orientation in the surface roughening step.

(9) The method of manufacturing a semiconductor light-emitting device according to the aforementioned (8), wherein the surface roughening step comprises:

a first step of etching the III-V compound semiconductor etch stop layer for patterning the same; and a second step of etching a surface of the second conductive type InP cladding layer using the patterned III-V compound semiconductor etch stop layer as a mask.

Advantageous Effect

In accordance with the present disclosure, a semiconductor light-emitting device and a and method of manufacturing the same are provided which can mitigate a multipeak in an emission spectrum in a bonding-type semiconductor light-emitting device having an InP cladding layer.

DETAILED DESCRIPTION

Prior to describing embodiments of this disclosure, the following points are described beforehand. First, in this specification, the expression "InGaAsP" alone for which the composition ratio is not specified means a given compound having a chemical composition ratio of group III elements (In and Ga in total) with respect to group V elements (As and P) of 1:1, in which the ratio between In and Ga that are group III elements and the ratio between As and P that are group V elements are undefined. In this case, there may be a possibility that one of In and G is not contained as the group III elements; or there may be a possibility that one of As and P is not contained as the group V elements. However, InGaAsP specified as "containing at least In and P" means that more than 0% and 100% or less of In is contained in the group III elements, and 0% and 100% or less of P is contained in the group V elements. Further, the expression "InGaP" means that As is not contained in "InGaAsP" above, and the expression "InGaAs" means that P is not contained in "InGaAsP" above. Similarly, the expression "InAsP" means that Ga is not contained in "InGaAsP" above, and the expression "GaAsP" means that In is not contained in "InGaAsP" above. Further, the expression "InP" means that Ga and As are not contained in "InGaAsP" above. Note that the ratio between the components of InGaAsP can be determined for example by a photoluminescence measurement or an X-ray diffraction measurement.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Zn, S, and Sn and does not serve as an electrically p-type or n-type layer is referred to as an "i-type" or "undoped" layer. An undoped InGaAsP layer may contain impurities that are inevitably mixed during the production process. Specifically, when the carrier density is low (for example, less than $4\times10^{16}/cm^3$), the layer is discussed as being "undoped" in this specification. Further, the values of the impurity concentrations of Zn, Sn, and the like, are determined by SIMS analyses.

The total thickness of the layers formed can be measured using a thickness measurement system using optical interferometry. Moreover, the thickness of each layer can be calculated by observing a cross section of the growth layer using a thickness measurement system using optical interferometry and a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

Figure 1:
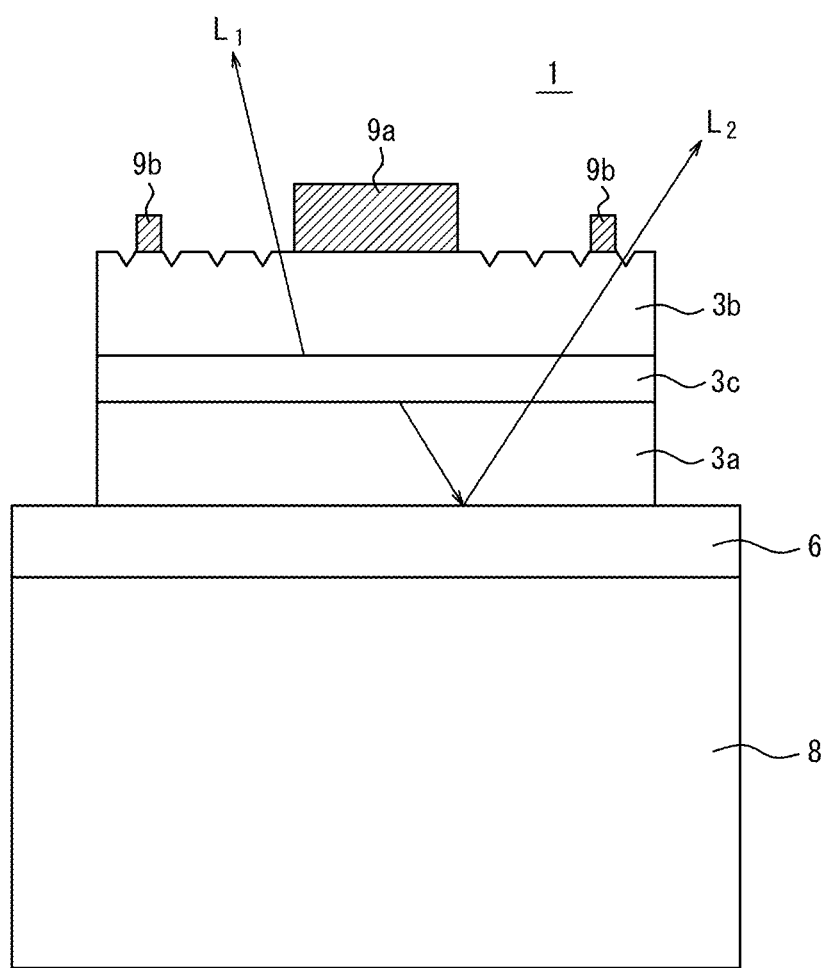
FIG. 1 is a schematic cross-sectional view illustrating a semiconductor light-emitting device according to an embodiment of the present disclosure.

Hereinafter, embodiments of the present disclosure will be described with reference to the drawings. Prior to describing embodiments of a semiconductor light-emitting device according to this embodiment, the relationships between the drawings will be described. FIG. 1 is a schematic cross-sectional view of a semiconductor light-emitting device 1 according to an embodiment of the present disclosure. FIGS. 2-6 are schematic cross-sectional views illustrating steps in a method of manufacturing a semiconductor light-emitting device 100 according to a preferred embodiment of the present disclosure. FIG. 6 depicts semiconductor light-emitting device 100' in which a back electrode 91 and an upper face electrode 93 have been formed in the semiconductor light-emitting device 100 depicted in FIG. 5B.

Figure 3:
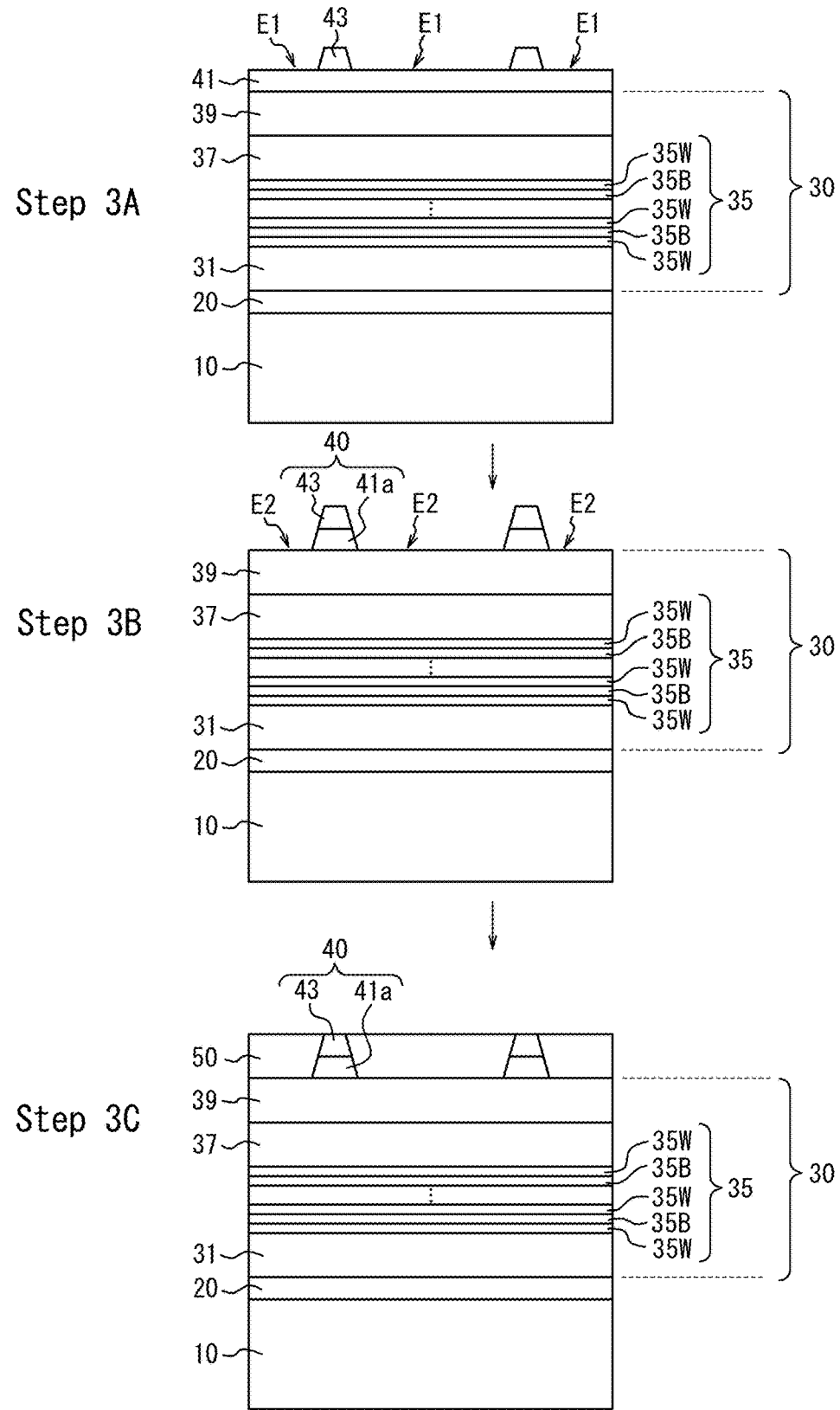
FIG. 3 is a schematic cross-sectional view in the manufacturing steps subsequent to FIG. 2 of the semiconductor light-emitting device according to the preferred embodiment of the present disclosure.
Figure 7:
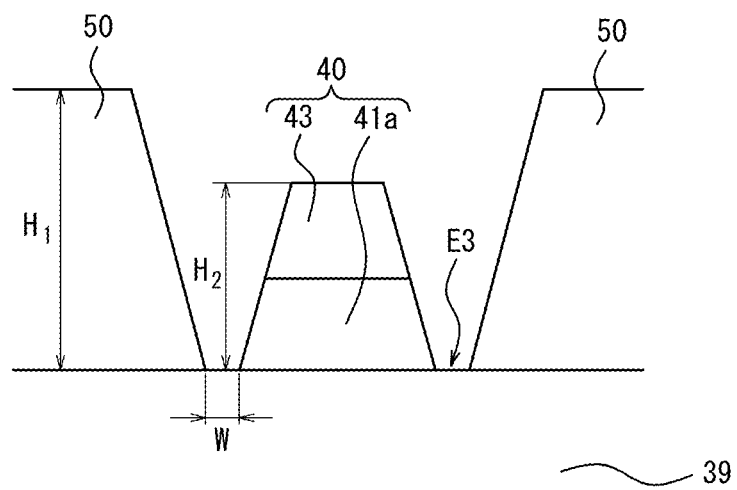
FIG. 7 is a schematic cross-sectional view illustrating a preferred mode of a vicinity of a dielectric layer and a contact portion in a semiconductor light-emitting device according to a preferred embodiment of the present disclosure.
Figure 8:
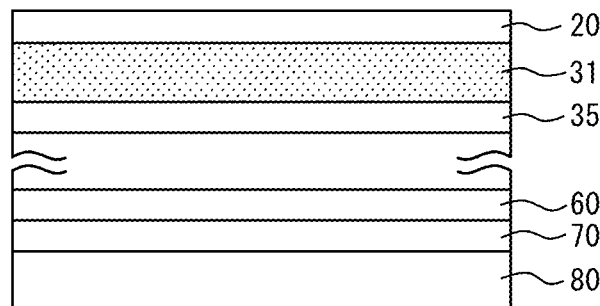
FIG. 8 is a schematic cross-sectional view illustrating a preferred mode of a surface roughening in the manufacturing steps of a semiconductor light-emitting device according to a preferred embodiment of the present disclosure.
Figure 8:
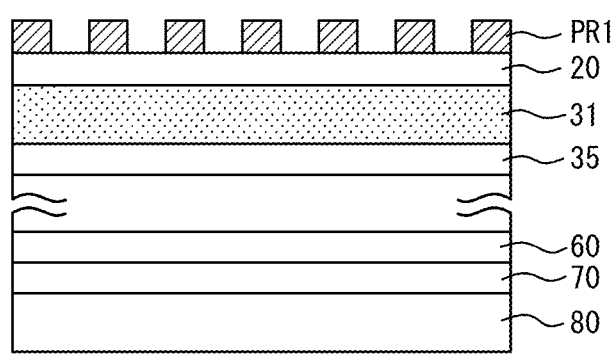
Figure 8:
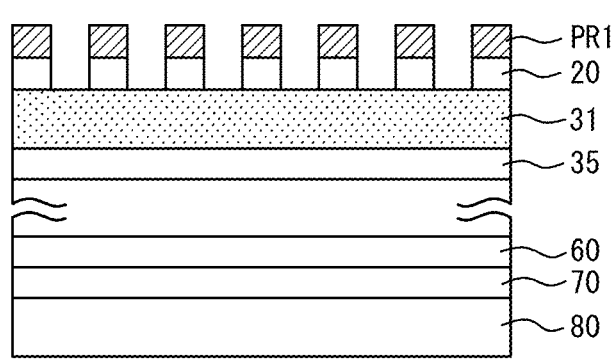
Figure 8:
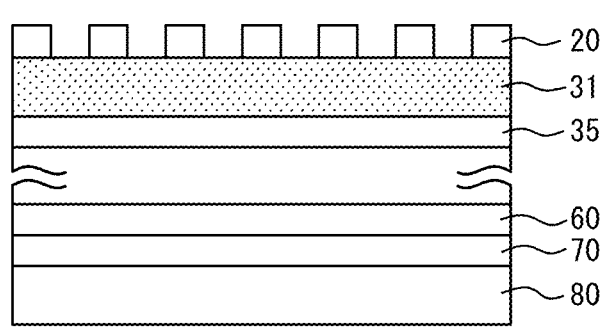
Figure 9:
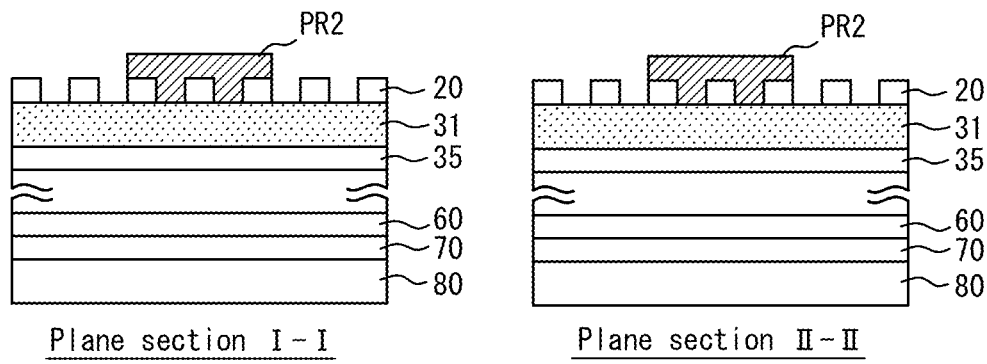
FIG. 9 is a schematic cross-sectional view illustrating the preferred mode of the surface roughening in the manufacturing steps of a semiconductor light-emitting device according to a preferred embodiment of the present disclosure.
Figure 9:
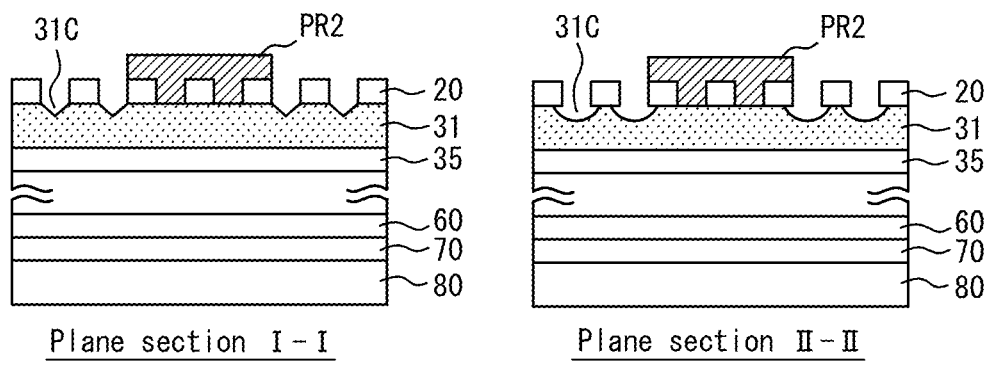
Figure 9:
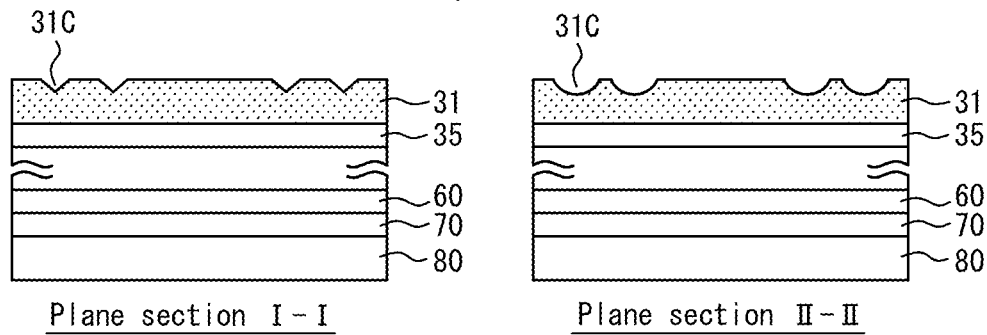
Figure 10A:
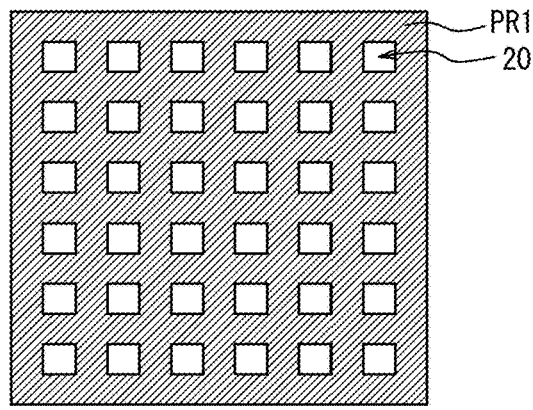
FIG. 10A is a schematic plan view illustrating a preferred mode of a surface roughening in the manufacturing steps of a semiconductor light-emitting device according to a preferred embodiment of the present disclosure.
Figure 10B:
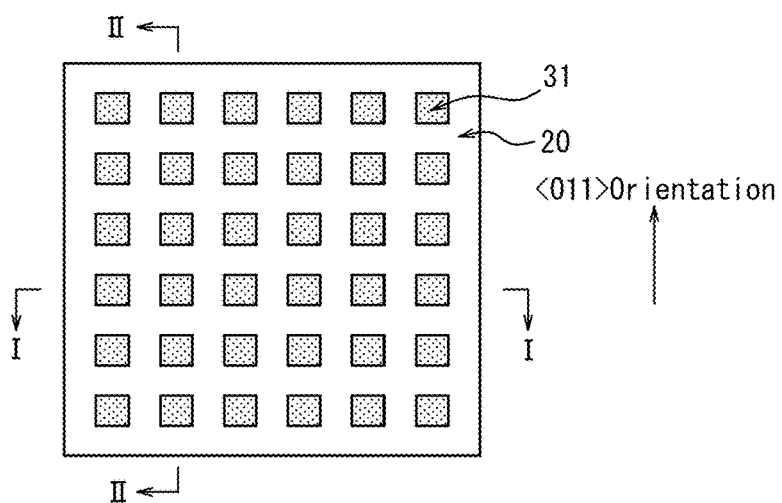
FIG. 10B is a schematic plan view illustrating the preferred mode of a surface roughening in the manufacturing steps of a semiconductor light-emitting device according to the preferred embodiment of the present disclosure.

Further, FIG. 7 is an enlarged view illustrating a preferred mode of a vicinity of a dielectric layer 50 and a contact portion 40 that may be formed in Step 3C in FIG. 3. FIGS. 8 and 9 are schematic cross-sectional views illustrating a preferred mode of a surface roughening step carried out in FIG. 5A to FIG. 5B, and a plurality of recesses may be provided in a surface of an InP cladding layer in this order. Note that FIG. 10A is a schematic plan view corresponding to Step 8B in FIG. 8, and FIG. 10B is a schematic plan view corresponding to Step 8D in FIG. 8.

In principle, components that are identical to each other are herein denoted by the same reference symbols, and thus a description thereof will be omitted. A substrate and layers in each drawing are exaggerated in width and thickness for convenience of description, so that the ratio between the vertical and horizontal dimensions of each illustrated component does not conform to the actual ratio.

(Semiconductor Light-Emitting Device 1)

A semiconductor light-emitting device 1 according to an embodiment of the present disclosure is a semiconductor light-emitting device including a first conductive type InP cladding layer 3a, a semiconductor light-emitting layer 3c, and a second conductive type InP cladding layer 3b provided sequentially over a conductive support substrate 8, in which the second conductive type InP cladding layer 3b is on the light extraction side. The semiconductor light-emitting device 1 further includes a metal reflective layer 6 between the conductive support substrate 8 and the first conductive type InP cladding layer 3a, for reflecting light emitted from the semiconductor light-emitting layer 3c. The metal reflective layer 6 that cannot be grown in an epitaxy is provided, and accordingly the semiconductor light-emitting device 1 according to this embodiment is a so-called bonding-type semiconductor light-emitting device. Here, in the semiconductor light-emitting device 1, a plurality of recesses are provided in a surface of the second conductive type InP cladding layer 3*b*. Note that, in the semiconductor light-emitting device 1, a top electrode including a pad portion 9*a* and a wiring portion 9*b* may be formed on the second conductive type InP cladding layer 3*b*, and a back electrode may be formed on the back surface of the conductive support substrate (not illustrated).

In the semiconductor light-emitting device 1, light emitted from the semiconductor light-emitting layer 3*c* is roughly divided into light $L_1$ traveling toward the second conductive type InP cladding layer 3*b*, and light $L_2$ traveling toward the first conductive type InP cladding layer 3*a*. In this embodiment, a plurality of recesses are provided in the surface of the second conductive type InP cladding layer 3*b*, interference between the light $L_1$ and the light $L_2$ is mitigated. As a result, a multipeak in an emission spectrum is mitigated.

In the case where the conductive type of the first conductive type InP cladding layer 3*a* is n-type, the second conductive type InP cladding layer 3*b* is p-type. On the contrary, in the case where the conductive type of the first conductive type InP cladding layer 3*a* is p-type, the second conductive type InP cladding layer 3*b* is n-type.

This semiconductor light-emitting device 1 can be fabricated according to a manufacturing method as follows. Specifically, a method of manufacturing the semiconductor light-emitting device 1 includes a semiconductor layer formation step of forming a III-V compound semiconductor etch stop layer containing In, Ga, and As, a second conductive type InP cladding layer 3*b*, a semiconductor light-emitting layer 3*c*, and a first conductive type InP cladding layer 3*a* sequentially over a growth substrate; a metal reflective layer formation step of forming a metal reflective layer 6 on the first conductive type InP cladding layer 3*a* for reflecting light emitted from the semiconductor light-emitting layer 3*c*; a bonding step of bonding a conductive support substrate 8 having a surface provided with a metal bonding layer to the metal reflective layer 6 having the metal bonding layer interposed therebetween; a substrate removal step of removing the growth substrate; and a surface roughening step of forming a plurality of recesses in a surface of the second conductive type InP cladding layer 3*b*, after the substrate removal step. Note that the growth substrate and the III-V compound semiconductor etch stop layer are removed ultimately. Note that any materials having etching selectivity to the growth substrate may be used for forming the III-V compound semiconductor etch stop layer, and InGaAs may be used for the etch stop layer or InGaAsP may also be used for the etch stop layer, for example.

Hereinafter, elements in the semiconductor light-emitting device 1 in accordance with the present disclosure will be described by providing descriptions to each step of manufacturing a semiconductor light-emitting device 100 according to a preferred embodiment of the present disclosure. Note that elements in the semiconductor light-emitting device 1 and elements in the semiconductor light-emitting device 100 correspond to each other as follows. Specifically, the first conductive type InP cladding layer 3*a* corresponds to a p-type InP cladding layer 37, the semiconductor light-emitting layer 3*c* corresponds to a semiconductor light-emitting layer 35, the second conductive type InP cladding layer 3*b* corresponds to an n-type InP cladding layer 31, the metal reflective layer 6 corresponds to a metal reflective layer 60, and the conductive support substrate 8 corresponds to the conductive support substrate 80.

(Method of Manufacturing Semiconductor Light-Emitting Device 100)

A method of manufacturing the semiconductor light-emitting device 100 according to a preferred embodiment of the present disclosure preferably includes a semiconductor layer formation step, a contact layer step, a dielectric layer formation step, a metal reflective layer formation step, a bonding step, a substrate removal step, and a surface roughening step, which will be described in detail in the following.

Figure 2:
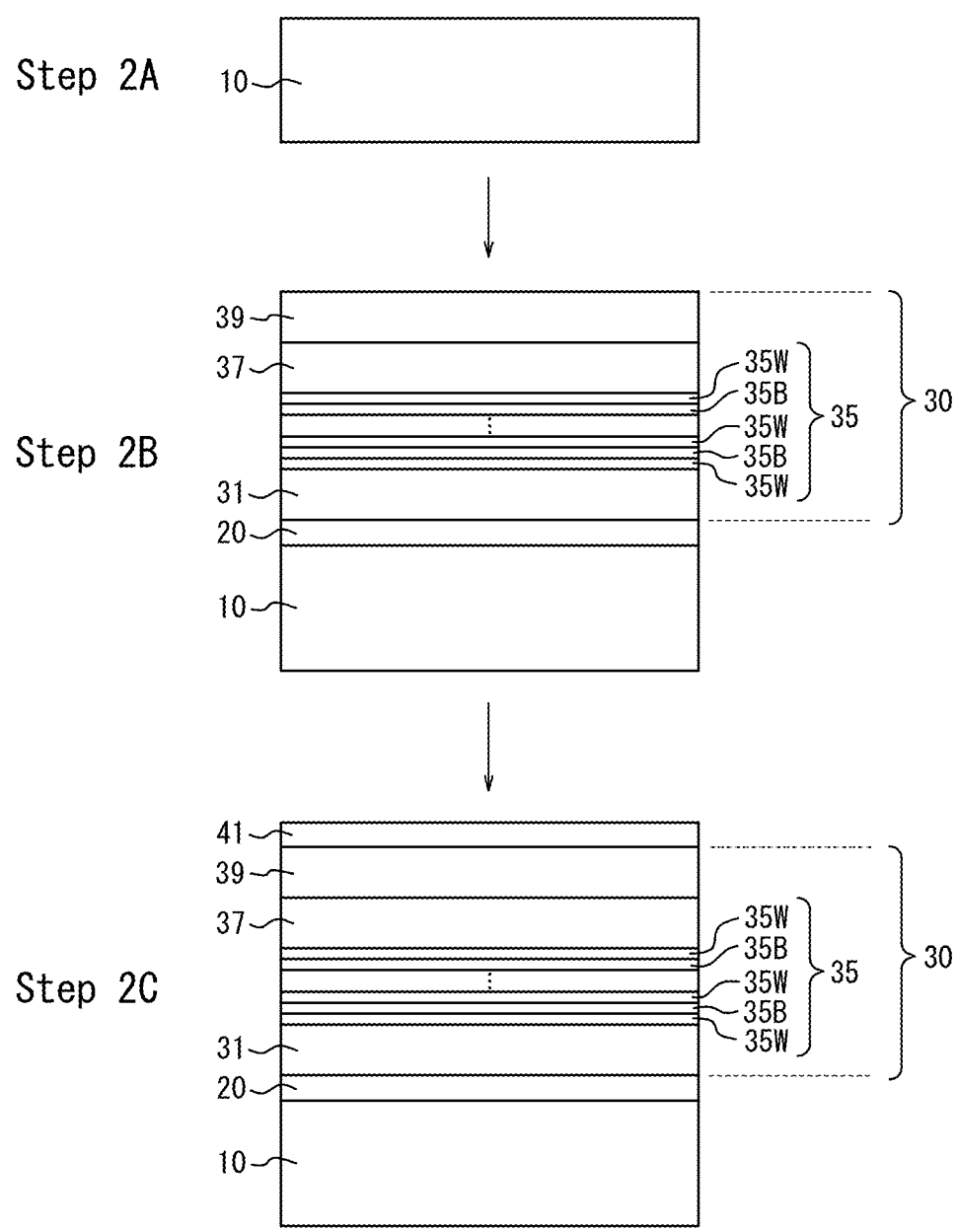
FIG. 2 is a schematic cross-sectional view in manufacturing steps of a semiconductor light-emitting device according to a preferred embodiment of the present disclosure.

In the semiconductor layer formation step, a III-V compound semiconductor etch stop layer 20 is formed on a growth substrate 10, and a p-type InP cladding layer 37, a semiconductor light-emitting layer 35, and an n-type InP cladding layer 31 are then formed sequentially to form a semiconductor stack 30 (Steps 2A and 2B in FIG. 2).

In the contact portion formation step, initially, a contact layer 41 made of a III-V compound semiconductor is formed on the semiconductor stack 30 (Step 2C in FIG. 2). Subsequently, an ohmic metal portion 43 is formed on parts of the contact layer 41 leaving an exposed area E1 on the surface of the contact layer 41 (Step 3A in FIG. 3). Subsequently, the contact layer 41 of the exposed area E1 is removed so that a surface of the semiconductor stack 30 is exposed, thereby forming a contact portion 40 composed of the ohmic metal portion 43 and the contact layer 41*a* and providing an exposed surface E2 of the semiconductor stack 30 (Step 3B in FIG. 3).

In the dielectric layer formation step, a dielectric layer 50 is formed on at least part of the exposed surface E2 of the semiconductor stack 30 (Step 3C in FIG. 3). In the metal reflective layer formation step, a metal reflective layer 60 for reflecting light emitted from the semiconductor light-emitting layer 35 is formed on the dielectric layer 50 and the contact portions 40 (Step 4A in FIG. 4). In the bonding step, a conductive support substrate 80 having a surface provided with a metal bonding layer 70, is bonded to the metal reflective layer 60 having the metal bonding layer interposed therebetween (Step 4B in FIG. 4).

Figure 5A:
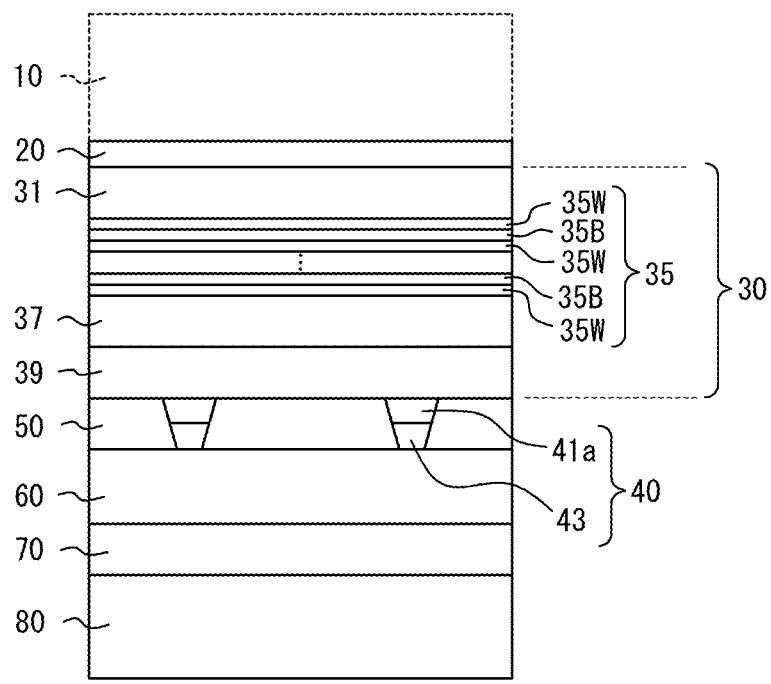
FIG. 5A is a schematic cross-sectional view in the manufacturing steps of a semiconductor light-emitting device according to the preferred embodiment of the present disclosure.
Figure 5B:
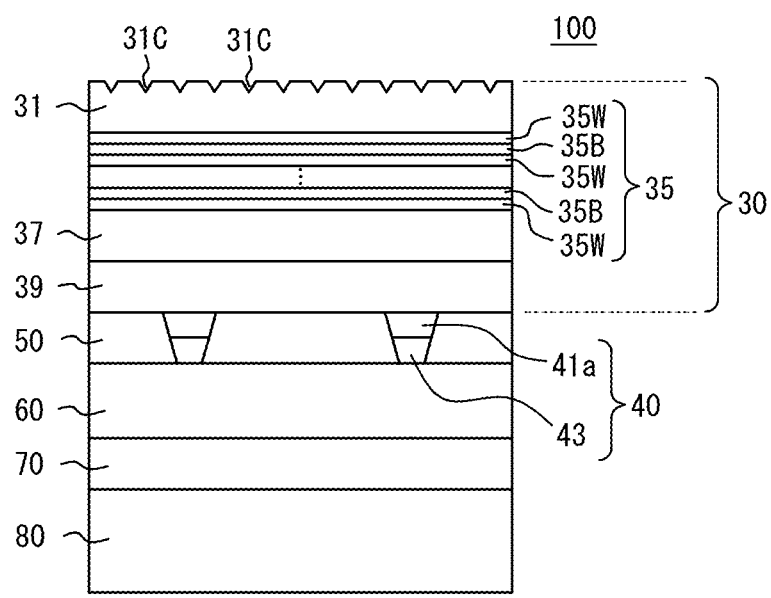
FIG. 5B is a schematic cross-sectional view in the manufacturing steps of a semiconductor light-emitting device according to the preferred embodiment of the present disclosure.
Figure 6:
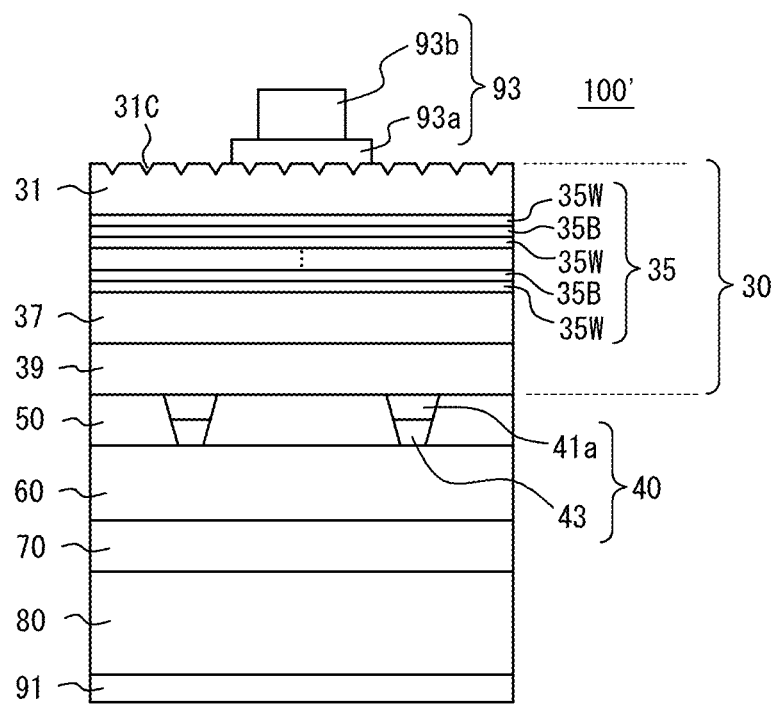
FIG. 6 is a schematic cross-sectional view of a semiconductor light-emitting device manufactured according to a preferred embodiment of the present disclosure.

Then, in the substrate removal step, the growth substrate 10 is removed (FIG. 5A). Thereafter, a surface roughening step of forming a plurality of recesses 31C in the surface of the n-type InP cladding layer 31 is carried out (FIG. 5B). In this manner, the semiconductor light-emitting device 100 according to a preferred embodiment of the present disclosure can be manufactured. In the following, the details of each step will be described in sequence.

<Semiconductor Layer Formation Step>

In the semiconductor layer formation step, the III-V compound semiconductor etch stop layer 20 is formed on the growth substrate 10, and the p-type InP cladding layer 37, the semiconductor light-emitting layer 35, and the n-type InP cladding layer 31 are then formed sequentially to form the semiconductor stack 30 (Steps 2A and 2B in FIG. 2).

In the semiconductor layer formation step, as depicted in Step 2A in FIG. 2, initially, the growth substrate 10 is provided. Since the n-type InP cladding layer 31 and the p-type InP cladding layer 37 are to be formed in this embodiment, an InP substrate is preferably used as the growth substrate 10. Any of generally available n-type InP substrates, undoped InP substrates, and p-type InP substrates may be used as the InP substrate. For convenience of description, a preferred embodiment in which an n-type InP substrate is used as the growth substrate 10 will be described.

Next, on the growth substrate 10, the III-V compound semiconductor etch stop layer 20 is formed. As described above, any materials having etching selectivity to the growth substrate 10 may be used for the III-V compound semiconductor etch stop layer 20, and InGaAs may be used for the etch stop layer for an InP substrate, or InGaAsP may also be used for the etch stop layer, for example. The III-V compound semiconductor etch stop layer 20 can be used when the growth substrate 10 is removed by etching in the substrate removal step. In the case where an n-type InP substrate is used as the growth substrate 10, the conductive type of the III-V compound semiconductor etch stop layer 20 is preferably n-type so that the conductive type of the III-V compound semiconductor etch stop layer 20 matches the conductive type of the growth substrate. In the case where InGaAs is used for the III-V compound semiconductor etch stop layer 20, the content of In as a group III element in InGaAs is preferably 0.3 to 0.7, more preferably 0.5 to 0.6, such that InGaAs can be lattice matched with the n-type InP substrate.

Subsequently, the p-type InP cladding layer 37, the semiconductor light-emitting layer 35, and the n-type InP cladding layer 31 are formed sequentially over the III-V compound semiconductor etch stop layer 20, to form the semiconductor stack 30. Since the semiconductor light-emitting layer 35 is sandwiched between the n-type InP cladding layer 31 and the p-type InP cladding layer 37, the semiconductor light-emitting layer 35 is preferably a layer made of an InGaAsP-based III-V compound semiconductor containing at least In and P. The semiconductor stack 30 may be made such that the semiconductor light-emitting layer 35 may have a double hetero (DH) structure in which the semiconductor light-emitting layer 35 is sandwiched between the n-type InP cladding layer 31 and the p-type InP cladding layer 37 or a multiple quantum well (MQW) structure. With a view to improving the light output power by reducing crystal defects, the semiconductor light-emitting layer 35 more preferably has a multiple quantum-well structure. A multiple quantum-well structure can be formed by alternately repeatedly providing well layers 35W and barrier layers 35B. The well layers 35W may be of InGaAsP, and the barrier layers 35B are preferably of InGaAsP or InP having a larger band gap than the well layers 35W. A provision of such a semiconductor stack 30 as described above allows the semiconductor light-emitting device 100 to emit light having a wavelength in a desired near-infrared region. For example, an emission peak wavelength of 1000 nm to 1650 nm can be achieved by varying the composition of the InGaAsP-based III-V compound. In the case of a MQW structure, an emission peak wavelength of 1000 nm to 1900 nm can be achieved by in addition to varying the composition of the InGaAsP-based III-V compound, applying strain to the well layers by controlling the composition difference between the well layers and the barrier layers. Further, when the chemical composition of the well layers 35W is expressed as $In_{xw}Ga_{1-xw}As_{yw}P_{1-yw}$, $0.5 \leq xw \leq 1$ and $0.5 \leq yw \leq 1$ can be satisfied, and $0.6 \leq xw \leq 0.8$ and $0.3 \leq yw \leq 1$ are preferably satisfied.

The total thickness of the semiconductor stack 30 may be for example, but not limited to, 2 μm to 8 μm. Similarly, the thickness of the n-type InP cladding layer 31 may be for example, but not limited to, 1 μm to 5 μm. Further, the thickness of the semiconductor light-emitting layer 35 may be for example, but not limited to, 100 nm to 1000 nm. Similarly, the thickness of the p-type InP cladding layer 37 may be for example, but not limited to, 0.8 μm to 3 μm. When the semiconductor light-emitting layer 35 has a quantum well structure, the thickness of the well layers 35W may be 3 nm to 15 nm, and the thickness of the barrier layers 35B may be 5 nm to 15 nm. The number of pairs of both layers may be 3 to 50.

Further, the semiconductor stack 30 preferably has a p-type cap layer 39 made of InGaAsP containing at least In and P on the p-type InP cladding layer 37. The lattice mismatch can be reduced by providing the p-type cap layer 39. The thickness of the cap layer 39 may be for example, but not limited to, 50 nm to 200 nm. In the following embodiment, for convenience of description, description is made assuming that the outermost surface layer of the semiconductor stack 30 is the p-type cap layer 39; however, since the p-type cap layer 39 is an optional component, the outermost surface layer of the semiconductor stack 30 may be for example, the p-type InP cladding layer 37.

Although not shown, the semiconductor stack 30 preferably has an i-type InP spacer layer each between the n-type InP cladding layer 31 and the semiconductor light-emitting layer 35 and between the semiconductor light-emitting layer 35 and the p-type cladding layer 37. The provision of the i-type InP spacer layers can hinder dopant diffusion. The thickness of the i-type InP spacer layers may be for example, but not limited to, 50 nm to 400 nm. The semiconductor stack 30 may further have an n-type InGaAsP layer having a composition ratio different from that of the III-V compound semiconductor etch stop layer 20, between the n-type InP cladding layer 31 and the III-V compound semiconductor etch stop layer 20.

Here, the layers in the semiconductor stack 30 can be formed by epitaxial growth, for example by a well-known thin film deposition technique such as metalorganic chemical vapor deposition (MOCVD), molecular beam epitaxy (MBE), or sputtering. For example, trimethylindium (TMIn) may be used as an In source, trimethylgallium (TMGa) as a Ga source, arsine ($AsH_3$) as an As source, and phosphine ($PH_3$) as a P source at a predetermined mixing ratio, and these source gases may be subjected to vapor phase epitaxy using a carrier gas to form an InGaAsP layer having a desired thickness by controlling the growth time. Note that other InGaAsP layers, such as the III-V compound semiconductor etch stop layer 20, to be epitaxially grown may be formed in a similar manner. When the layers are p-type or n-type doped, a dopant source gas can be used in addition as desired.

<Contact Portion Formation Step>

In the contact portion formation step, initially, the contact layer 41 made of a III-V compound semiconductor is formed on the semiconductor stack 30 (Step 2C in FIG. 2). For example, as illustrated in Step 2C in FIG. 2, the p-type contact layer 41 can be formed on the p-type cap layer 39. The p-type contact layer 41 is a layer which is in contact with the ohmic metal portion 43, is interposed between the ohmic metal portion 43 and the semiconductor stack 30, and has a composition allowing for lower contact resistance with the ohmic metal portion 43 than with the semiconductor stack 30. For example, a p-type InGaAs layer can be used as the p-type contact layer 41. The thickness of the contact layer 41 may be for example, but not limited to, 50 nm to 200 nm.

Subsequently, the ohmic metal portion 43 is formed on parts of the contact layer 41 leaving the exposed area E1 on a surface of the contact layer 41 (Step 3A in FIG. 3). The ohmic metal portion 43 can be formed into islands distributed in a predetermined pattern. When a p-type InGaAs layer is used as the p-type contact layer 41, for example, Au, AuZn, AuBe, AuTi, and the like, can be used as the ohmic metal portion 43, and a structure in which those materials are stacked can preferably be used as the ohmic metal portion 43. For example, Au/AuZn/Au (a stack of Au, AuZn, and Au in this order) may be used as the ohmic metal portion 43. The thickness (or the total thickness) of the ohmic meal portion 43 may be for example, but not limited to 300 nm to 1300 nm, preferably 350 nm to 800 nm.

Here, for example, the exposed area E1 can be left on the surface of the contact layer 41 by forming a resist pattern on a surface of the contact layer 41, vapor depositing the ohmic metal portion 43, and removing the resist pattern by lift-off. Alternatively, the ohmic metal portion 43 may be formed by forming a predetermined metal layer on the entire surface of the contact layer 41, forming a mask on the metal layer, and performing for example etching. In either case, as illustrated in Step 3A of FIG. 3, the ohmic metal portion 43 is formed on parts of the contact layer 41, the surface of the contact layer 41 which is not in contact with the ohmic metal portion 43, that is, the exposed area E1 may be formed Note that, the shape of the ohmic metal portion 43 may be a trapezoidal shape in a cross-sectional view in some cases as illustrated in Step 3A of FIG. 3 by way of schematic illustration only. The ohmic metal portion 43 may be formed into a rectangular shape or may have rounded corners in a cross-sectional view.

Further, in the contact portion formation step, the contact layer 41 of the exposed area E1 is removed so that a surface of the semiconductor stack 30 is exposed, thereby forming the contact portion 40 composed of the ohmic metal portion 43 and the contact layer 41a and providing the exposed surface E2 of the semiconductor stack 30 (Step 3B in FIG. 3). Specifically, the contact layer 41 of an area other than the areas of the ohmic metal portion 43 that has been formed beforehand is etched to expose a surface of the p-type cap layer 39 which is the outermost surface layer of the semiconductor stack 30, thereby obtaining the contact layer 41a. For example, a resist mask may be formed on and around (approximately 2 μm to 5 μm of) the ohmic metal portion 43, and the exposed area E1 of the contact layer 41 may be wet etched using tartaric acid-hydrogen peroxide mixture. Alternatively, wet etching may be performed using etchant solutions, such as inorganic acid-hydrogen peroxide mixture, organic acid-hydrogen peroxide mixture, and the like. Further, when a mask is formed on the above-described predetermined metal layer and etching is performed to form the ohmic metal portion 43 for providing the exposed area E1, etching can be performed continuously.

Note that the thickness of the contact portion 40 corresponds to the total thickness of the contact layer 41 (41a) and the ohmic metal portion 43 and may be 350 nm to 1500 nm, more preferably 400 nm to 1000 nm.

<Dielectric Layer Formation Step>

In the dielectric layer formation step, the dielectric layer 50 is formed on at least part of the exposed surface E2 of the semiconductor stack 30 (Step 3C in FIG. 3). Such a dielectric layer 50 may be formed for example as follows.

First, a dielectric layer is deposited on the entire surface of the semiconductor stack 30 so as to cover the semiconductor stack 30 and the contact portion 40. For the film deposition, a well-known technique such as plasma CVD or sputtering can be used. When a dielectric on a contact portion is formed in the dielectric layer 50 over the contact portion 40 in the surface of the deposited dielectric layer, a mask may be formed as desired and the dielectric on the contact portion may be removed by etching or the like. For example, the dielectric on the contact portion may be wet etched using buffered hydrofluoric acid (BHF) or the like.

Note that, as illustrated in FIG. 7, it is also preferred that the dielectric layer 50 is formed on part of the exposed surface E2 of the semiconductor stack 30 leaving an exposed portion E3 around the contact portion 40. The dielectric layer 50 and the exposed portion E3 described above may be formed for example as follows. First, a dielectric layer is deposited on the entire surface of the semiconductor stack 30, and a window pattern completely surrounding the contact portion is formed using resist above the contact portion 40 in the surface of the deposited dielectric layer. In this case, the window pattern is preferably 1 μm to 5 μm larger than the contact portion both in the width direction and the longitudinal direction. Using the thus formed resist pattern to remove the dielectric around the contact portion by etching, the dielectric layer 50 can be formed, and the exposed portion E3 is formed around the contact portion 40.

In order to ensure to obtain this structure, the width W of the exposed portion E3 is preferably 0.5 μm or more and 5 μm or less, more preferably 1 μm or more and 3.5 μm or less (see FIG. 7).

Here, the ratio of the area of the dielectric layer 50 in contact with the semiconductor stack 30 (contact area ratio) is preferably 80% or more and 95% or less. This is because, when the area of the contact portion 40 is reduced and the area of the dielectric layer 50 is increased, absorption of light by the contact portion can be reduced. Note that the contact area ratio can be measured on a wafer, and when the contact area ratio is calculated backwards from the state of singulated semiconductor light-emitting devices, the calculation can be performed assuming that the width of the semiconductor layer at each end (a region where the electric layer has been present) removed by singulation is 20 μm to 30 μm (40 μm to 60 μm for both ends in total).

Note that, in the dielectric layer formation step, the relationship between the thickness $H_1$ of the dielectric layer 50 and the thickness $H_2$ of the contact portion 40 is not limited in particular; however, as illustrated in FIG. 7, when the thickness of the dielectric layer 50 is expressed as $H_1$ and the thickness of the contact portion is expressed as $H_2$, $H_1 \geq H_2$ can be satisfied, and $H_1 > H_2$ is preferably satisfied. Under these conditions, the thickness of the dielectric layer 50 may be for example, but not limited to 360 nm to 1600 nm, more preferably 410 nm to 1100 nm. Further, the difference between the thickness $H_1$ of the dielectric layer and the thickness $H_2$ of the contact portion 40: $H_1-H_2$ is preferably 10 nm or more and 100 nm or less.

Moreover, the dielectric layer 50 may use $SiO_2$, SiN, ITO, AlN, and the like, and the dielectric layer 50 is preferably made of $SiO_2$ in particular. This is because $SiO_2$ can easily be treated by etching using BHF or the like.

<Metal Reflective Layer Formation Step>

Figure 4:
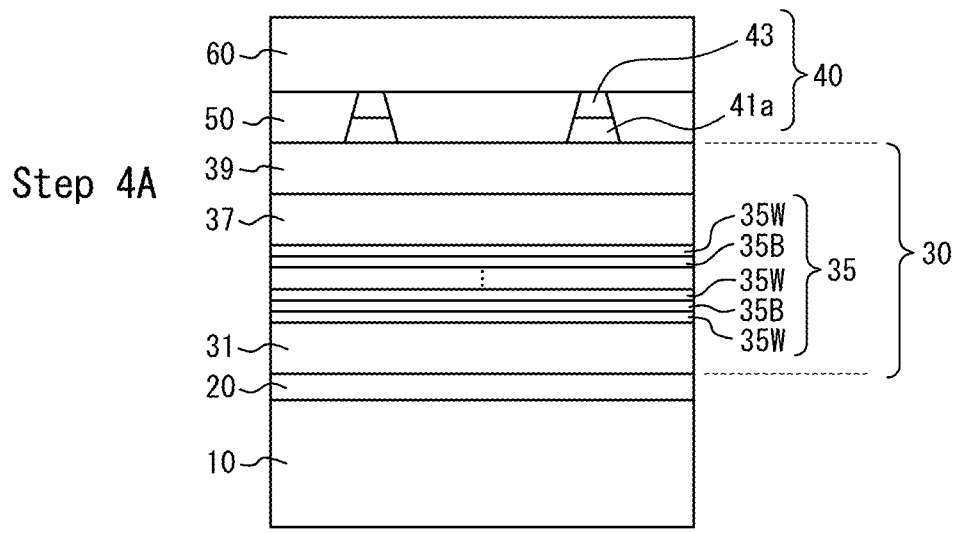
FIG. 4 is a schematic cross-sectional view in the manufacturing steps subsequent to FIG. 3 of the semiconductor light-emitting device according to the preferred embodiment of the present disclosure.
Figure 4:
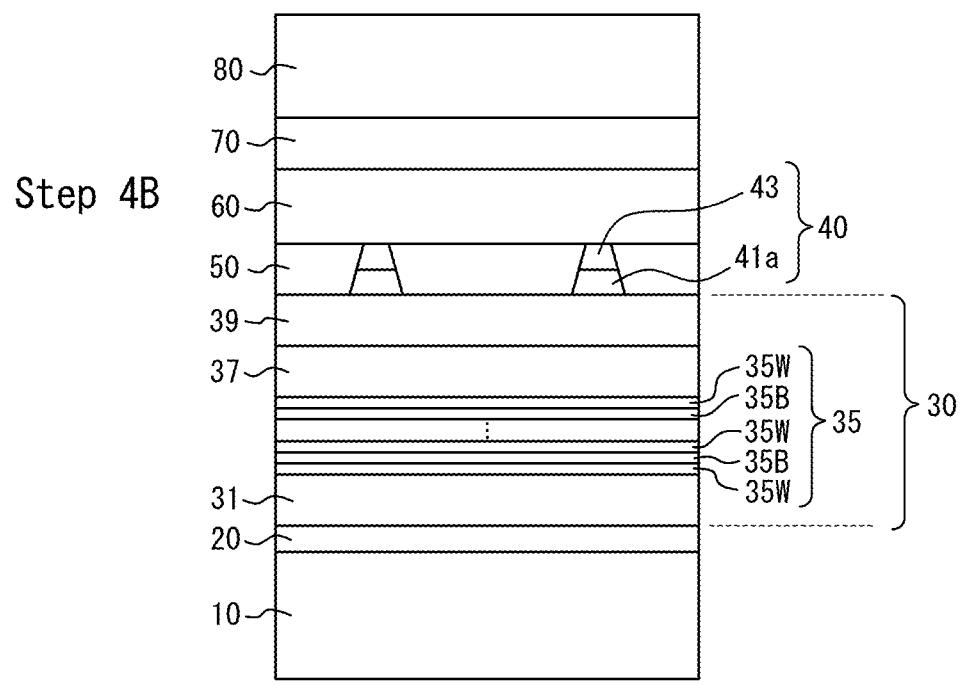

In the metal reflective layer formation step, the reflective metal layer 60 for reflecting light emitted from the semiconductor light-emitting layer 35 is formed on the dielectric layer 50 and the contact portion 40 (Step 4A in FIG. 4). Note that, when the exposed portion E3 has been formed in the dielectric layer formation step, the reflective metal layer 60 is formed also on the exposed portion E3. In order to provide an adequate reflectivity to emitted light, the reflective metal layer 60 preferably mainly contain Au. In this case, Au preferably composes more than 50% by mass in the composition of the reflective metal layer 60, and more preferably Au composes 80% by mass or more. The reflective metal layer 60 may include a plurality of metal layers; however, when it includes a metal layer made of Au (hereinafter "Au metal layer"), the thickness of the Au metal layer is preferably more than 50% of the total thickness of the reflective metal layer 60. Other than Au; Al, Pt, Ti, Ag, and the like, may be used as metals composing the reflective metal layer 60. For example, the reflective metal layer 60 may be constituted by a single layer made of Au only; alternatively, the reflective metal layer 60 may include two or more Au metal layers. In order to ensure bonding in the subsequent bonding step, the outermost surface layer of the reflective metal layer 60 (the surface opposite to the semiconductor stack 30) is preferably an Au metal layer. For example, metal layers of Al, Au, Pt, and Au may be formed in this order on the dielectric layer 50, the exposed portion E3, and the contact portion 40 to obtain the reflective metal layer 60. The thickness of one Au metal layer in the reflective metal layer 60 may be for example 400 nm to 2000 nm, and the thickness of each metal layer made of a metal other than Au may be for example 5 nm to 200 nm. The reflective metal layer 60 can be formed on the dielectric layer 50, the exposed portion E3, and the contact portion 40 by a typical technique such as a vapor deposition process.

<Bonding Step>

In the bonding step, the conductive support substrate 80 having a surface provided with the metal bonding layer 70 is bonded to the reflective metal layer 60 having the metal bonding layer 70 interposed therebetween (Step 4B in FIG. 4). On a surface of the conductive support substrate 80, the metal bonding layer 70 may have been formed by sputtering, vapor deposition, or the like. The metal bonding layer 70 and the reflective metal layer 60 are placed to face each other and put together, followed by bonding of the layers by thermocompression bonding at a temperature of approximately 250° C. to 500° C.

The metal bonding layer 70 bonded to the reflective metal layer 60 may be of metals such as Ti, Pt, and Au, or metals forming a eutectic alloy with gold (e.g., Sn), and is preferably formed from a stack of those materials. For example, a stack obtained by stacking Ti with a thickness of 400 nm to 800 nm, Pt with a thickness of 5 nm to 20 nm, and Au with a thickness of 700 nm to 1200 nm in this order on the surface of the conductive support substrate 80 can be used as the bonging layer 70. Note that in order to facilitate bonding between the reflective metal layer 60 and the metal bonding layer 70, a Au metal layer is provided as the outermost surface layer of the metal bonding layer 70, and Au is also provided as a metal layer of the reflective bonding layer 60 on the metal bonding layer 70 side to perform bonding between Au and Au by Au—Au diffusion bonding.

Note that a conductive Si substrate may be used as the conductive support substrate 80, for example, or a conductive GaAs or Ge substrate may also be used. In addition to the semiconductor substrates described above, metal substrates may also be used. The thickness of the conductive support substrate 80 may be 100 μm or more and 500 μm or less, although it varies depending on the material used, and when a Si substrate or an GaAs substrate is used, a substrate with a thickness of less than 180 μm can be handled. A Si substrate is particularly preferable in terms of heat dissipation, brittleness, and cost.

<Substrate Removal Step>

In the substrate removal step, the growth substrate 10 is removed (Step 5A). The growth substrate 10 can be removed by wet etching for example using a hydrochloric acid diluent, and when the III-V compound semiconductor etch stop layer 20 is formed, the wet etching can be stopped by this layer. The III-V compound semiconductor etch stop layer 20 may be removed by wet etching, for example, using an etchant solution of sulfuric acid-hydrogen peroxide mixture.

<Surface Roughening Step>

Figure 10C:
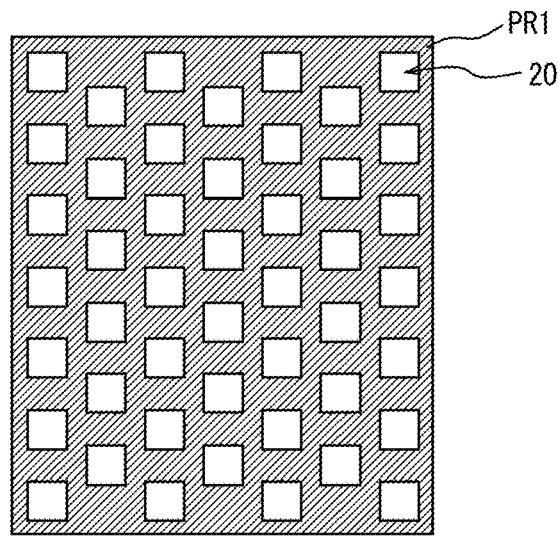
FIG. 10C is a schematic plan view illustrating a preferred mode of a surface roughening in the manufacturing steps of a semiconductor light-emitting device according to another preferred embodiment of the present disclosure.
Figure 11A:
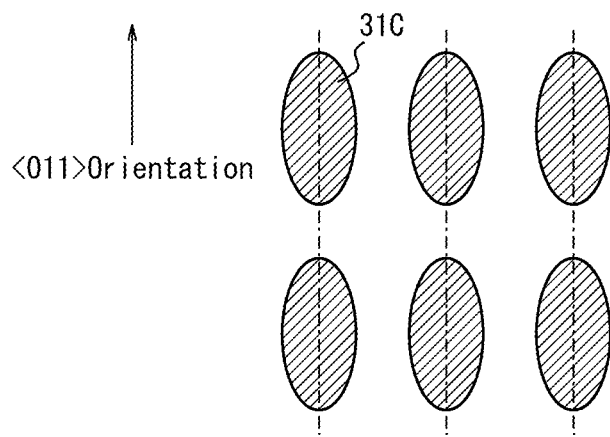
FIG. 11A is a schematic plan view illustrating a mode of an InP cladding layer in a semiconductor light-emitting device in accordance with the present disclosure.

In the surface roughening step, a plurality of recesses 31C are formed in the surface of the n-type InP cladding layer 31 (FIG. 5B). In this surface roughening step, as depicted in FIGS. 10B and 11A, and other drawings and descriptions, the bottoms of the recesses 31C are preferably made to be oriented along the <011> orientation. A preferred mode of the surface roughening step will be described referring to FIGS. 8-10.

As depicted in Steps 8A to 8D in FIG. 8, the surface roughening step preferably includes a first step of etching the III-V compound semiconductor etch stop layer to pattern it. Subsequent to the first step, the surface roughening step preferably further includes a second step of etching a surface of the n-type InP cladding layer 31 using the patterned III-V compound semiconductor etch stop layer 20 as a mask, as depicted in Steps 9A to 9D in FIG. 9. In the following, the first and second steps will be described in more detail.

<<First Step>>

Figure 13A:
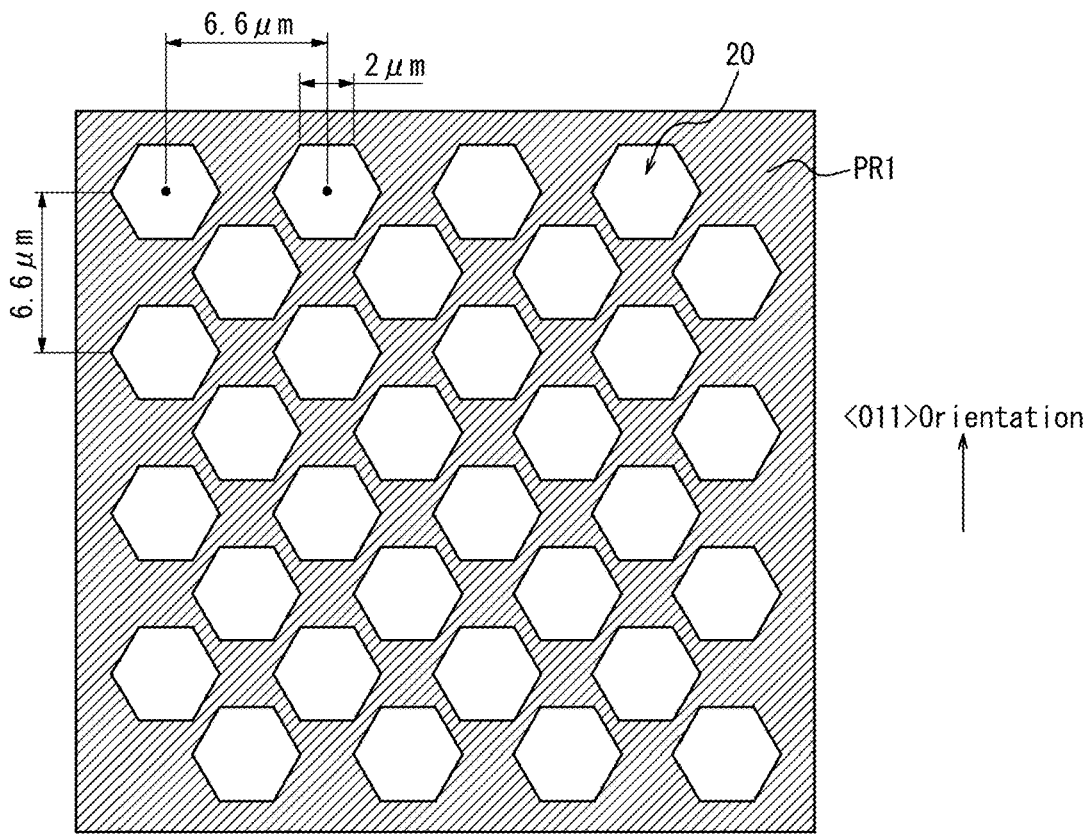
FIG. 13A is a schematic plan view of a mask pattern used to manufacture semiconductor light-emitting devices of Examples 1 and 2.
Figure 13B:
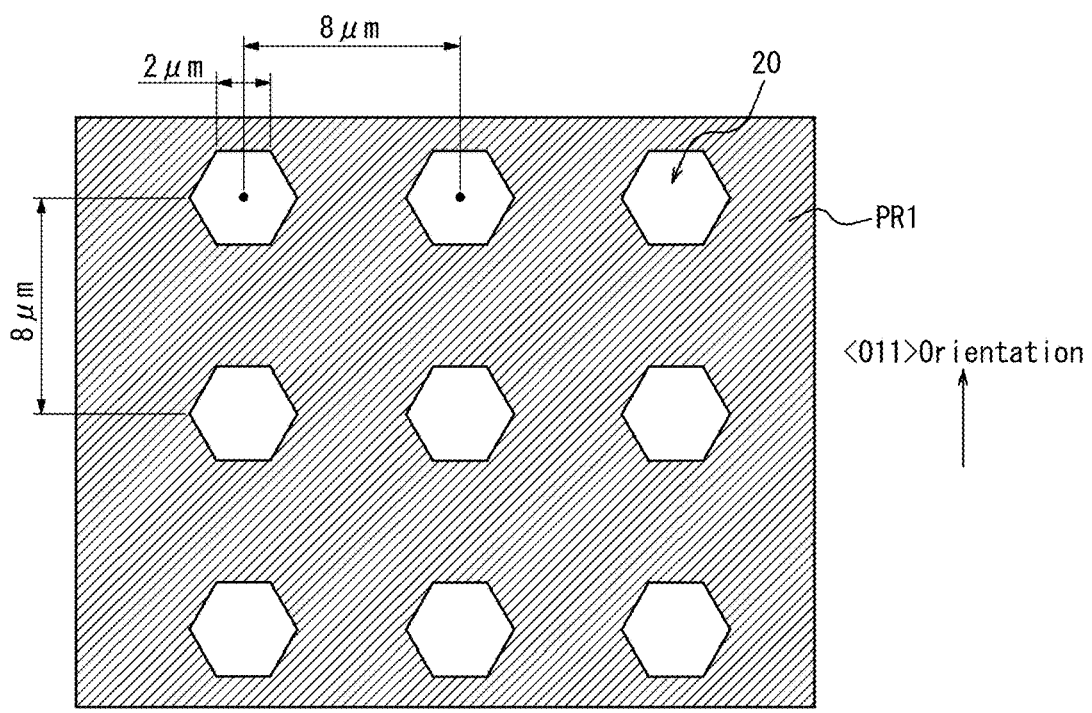
FIG. 13B is a schematic plan view of a mask pattern used to manufacture a semiconductor light-emitting device of Example 3.

Step 8A in FIG. 8 corresponds to the state where the growth substrate 10 depicted in FIG. 5A has been removed. In the first step, after the growth substrate 10 is removed (Step 8A in FIG. 8), a photoresist PR1 with a predetermined pattern is preferably formed on the III-V compound semiconductor etch stop layer 20 (Step 8B in FIG. 8). For the patterning, a photoresist may be applied and an exposure may be carried out. FIG. 10A is one example of a schematic plan view after the patterning. Then, the pattern of the photoresist PR1 can be transferred to the III-V compound semiconductor etch stop layer 20 by wet-etching the III-V compound semiconductor etch stop layer 20 using the photoresist PR1 as a mask (Step 8C in FIG. 8). The photoresist PR1 is then rinsed and removed as desired (FIG. 8 Step 8D). FIG. 10B is a schematic plan view at this state. Note that any pattern may be formed by the photoresist PR1, and FIG. 10A depicts a pattern in which the centers of the recesses are arranged two-dimensionally in a square lattice arrangement. In place of the pattern depicted in FIG. 10A, a pattern in which the centers of the recesses in the pattern are arranged two-dimensionally in a triangular lattice arrangement is also preferable, as depicted in FIG. 10C. In this case, the two-dimensionally arranged pattern of the recesses 31C formed in the first step and the subsequent second step can be made denser, which is more effective in mitigating a multipeak. Moreover, the two-dimensionally arranged pattern is preferably symmetric with respect to the <011> direction. Although the centers of the recesses in the pattern were arranged in lattice arrangements of isosceles triangles and regular quadrangles in Examples described below as depicted in FIGS. 13A and 13B, any other arrangements with different longitudinal-lateral ratios are also preferable.

<<Second Step>>

Subsequent to the first step, in the second step, the surface of the n-type InP cladding layer 31 is etched using the patterned III-V compound semiconductor etch stop layer 20 as a mask (Step B in FIG. 9). In the case where a region on which a top electrode is to be formed is made flat as depicted in Step 9A in FIG. 9, a photoresist PR2 preferably has been applied on that region beforehand. An etchant solution of hydrochloric acid-acetic acid mixture or the like is preferably used for etching the n-type InP cladding layer 31. Finally, the photoresist PR2 is rinsed and removed, then the III-V compound semiconductor etch stop layer 20 used as the mask can be removed by wet etching in an etchant solution of sulfuric acid-hydrogen peroxide mixture (Step 9C in FIG. 9). Note that it is not necessary to form a top electrode on a flat surface of the n-type InP cladding layer 31 as depicted in the semiconductor light-emitting device 100' in FIG. 6, and a wet etching of the n-type InP cladding layer 31 is commenced without forming the photoresist PR2 (Step 9A in FIG. 9).

Here, InP is highly aeolotropic, and the etch rates of InP vary significantly on different crystalline planes. Accordingly, upon forming the recesses 31C according to this preferred mode, as depicted in Step 9B in FIG. 9, the progresses of etching are different on the plane section I-I and on the plane section II-II in FIG. 10B. Specifically, recesses 31C are formed into V-shapes on the plane section I-I whereas etching proceeds also under the mask on the plane section II-II due to the difference in the etch rates. If a typical resist on the n-type InP cladding layer 31 is used as a mask, the resist would peel off during etching due to an insufficient adherence of the resist. Thus, roughening the surface of the n-type InP cladding layer 31 by wet etching is usually difficult. On the contrary, according to the preferred mode in which the III-V compound semiconductor etch stop layer 20, such as one of InGaAs, is used as a mask, roughening of the surface of the n-type InP cladding layer 31 is ensured.

The semiconductor light-emitting device 100 according to a preferred embodiment of the present disclosure can be manufactured by following the above-described steps.

<Recesses>

In accordance with the above-described preferred mode of a surface roughening, recesses 31C in wide variety of forms can be formed in a surface of the n-type InP cladding layer 31. Note that bottoms of the thus formed recesses 31C are oriented along the <011> orientation. Note that whether the bottoms of the recesses 31C are oriented along the <011> orientation can be determined from the plane orientation (the plane orientation of an orientation flat) measurable with X-ray diffraction of a growth substrate during a manufacturing stage, or from X-ray diffraction measurements with a smaller irradiation beam diameter in a semiconductor light-emitting device. Alternatively, micro-crystalline orientation measurement techniques, such as the EBSP, may also be used. It is also expected that tilted surfaces 31T of the recesses 31C are planes between the {100} plane and the {111} plane, for example (e.g., the (11-1) plane or the (1-11) plane with respect to the (100) plane), and is expected to be a plane close to the {111} plane. Because the etch rate approaches zero as the plane approaches the {111} plane, controls on the etch depths become easier and prevention of an overetch becomes easier.

Note that recesses 31C having bottoms 31V oriented along the <011> orientation appear characteristically on the surface of the InP cladding layer (the surface opposite to the growth direction) which is exposed after the growth substrate has been removed as in the present disclosure. If a surface of the InP cladding layer (i.e., on the side of the growth direction) would be etched in the similar manner without removing the growth substrate 10, the bottoms 31V of the recesses 31C along the <011> orientation would not appear due to a tilt of 90 degrees with respect to the <011> orientation.

Figure 11B:
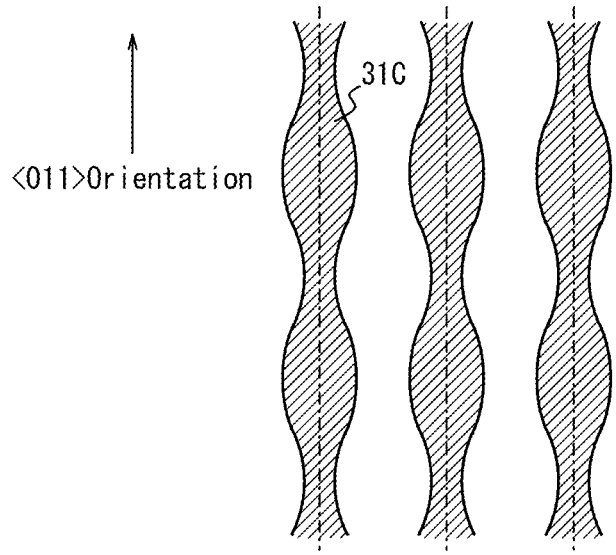
FIG. 11B is a schematic plan view illustrating another mode of an InP cladding layer in a semiconductor light-emitting device in accordance with the present disclosure.

When the mask having hexagon patterns as depicted in FIG. 11A is used, the recesses 31C can be formed in ellipses in plan view from the light extraction side of the semiconductor light-emitting device 100, and in this case the bottoms 31V of the recesses 31C will be orient along the long axes of the ellipses. When the dimension, the spacing, or the arrangement of hexagons is modified, a part of the ellipses in FIG. 11A are united as depicted in FIG. 11B, for example.

Figure 11C:
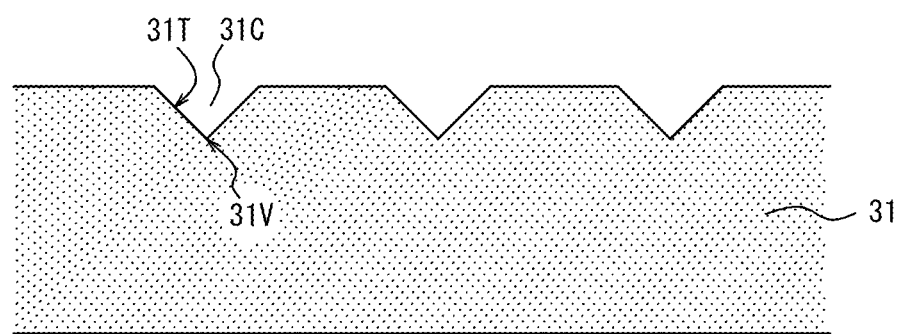
FIG. 11C is a schematic cross-sectional view of an InP cladding layer in a semiconductor light-emitting device in accordance with the present disclosure.

As a result, a pattern where the widths of the recesses 31C vary periodically in the direction of the central axes of the recesses 31C (known as the "Tatewakumon configuration" in Japanese), or a pattern where the recesses 31C are united in a direction other than the direction of the central axes, or a stripe patterns, may be formed. In such cases, the direction of the central axis will be oriented along the bottoms 31V of the recesses 31C. In any case, a cross-sectional view orthogonal to the <011> orientation may have a shape in FIG. 11C. Note that the pattern of mask is not limited to the regular hexagon pattern, and hexagons having different lengths of sides may also be used. When the lengths of sides of a hexagon are modified, the hexagon is preferably symmetric to the <011> orientation. Alternatively, the form is not limited to hexagons, and quadrilaterals, octagons, and other 2n-polygons may be used or substantial circles may also be used. However, in order to increase the ratio of the areas of recesses, hexagons are preferred. The forms of the recesses 31C vary according to a pattern in the mask, and it is considered that bottoms are oriented along the <011> orientation in any case.

The plurality of recesses 31C are preferably arranged regularly, and a dense and regular arrangement is more preferred. The more densely recesses 31C are arranged, the higher the effect of mitigating a multipeak becomes. More specifically, the ratio of areas occupied by the recesses 31C of 60% or more in plan view of the n-type InP cladding layer 31 (i.e., the area occupied by the recesses 31C of 0.6 cm$^2$ or more per unit area of 1 cm$^2$ of the n-type InP cladding layer 31) further ensures the effect of mitigating a multipeak. Furthermore, the space between adjacent recesses 31C on the surface of the n-type InP cladding layer 31 is preferably flat.

Note that, although not shown, the manufacturing method according to a preferred embodiment of the present disclosure preferably further includes a grinding step of grinding the conductive support substrate 80 to a thickness in a range of 80 μm or more and less than 200 μm. In this embodiment, a Si substrate may be used as the conductive support substrate 80, and the conductive support substrate 80 would not be broken even if it is ground to a thickness of less than 200 μm in this case. Further, the conductive support substrate 80 can be ground to a thickness of 150 μm or less, or may be ground to a thickness of 100 μm or less. However, when the conductive support substrate 80 is ground to a thickness of less than 80 μm, even a Si substrate would be damaged. Therefore, the lower limit of the thickness is preferably set to 80 μm. Further, when the thickness of the conductive support substrate 80 is 80 μm or more, the semiconductor light-emitting device 100 is sufficiently handleable.

This grinding step may be performed prior to the above bonding step, may be performed in any stage after the bonding step. More preferably, the grinding step is performed after the substrate removal step. Use of a thinned wafer reduces the process step, which prevents the breakage of the wafer more reliably. When the grinding step is performed after the substrate removal step, the grinding step is performed before the formation of the back electrode to be described. Note that the grinding of the conductive support substrate 80 formed from a Si substrate may be performed by typical mechanical grinding, and etching may be performed in addition to the mechanical grinding.

Note that the manufacturing method according to a preferred embodiment of the present disclosure may further have a step of forming, after the fabrication of the semiconductor light-emitting device 100, a back electrode 91 on the back surface of the conductive support substrate 80 and forming a top electrode 93 on the surface of the semiconductor stack 30 as illustrated in FIG. 6. The top electrode 93 may include a wiring portion 93a and a pad portion 93b. Through such steps, a semiconductor light-emitting device 100' can be fabricated. The back electrode 91 and the top electrode 93 can be formed by a well-known technique; for example, sputtering, electron-beam physical vapor deposition, resistance heating, and the like, can be used.

Further, since an n-type InP substrate is used as the growth substrate 10 in this embodiment for convenience of description, the layers formed on the growth substrate 10 have n-type and p-type conductivity types as described above. However, when a p-type growth substrate 10 is used, it can naturally be understood that those layers have n-type and p-type conductivity types in reverse order. Further, when an undoped substrate is used as the growth substrate 10, the conductivity type of those layers may be determined to correspond to the conductivity (p-type or n-type) of the semiconductor layers formed on the growth substrate 10.

Moreover, as depicted in the semiconductor light-emitting device in FIG. 1, prior to dicing, epitaxially formed semiconductor layers 3a, 3b, and 3c may be etched mesa.

EXAMPLES

Example 1

Although the present disclosure will be described in more detail below using examples, this disclosure is not limited to the following examples. A semiconductor light-emitting device of Example 1 was fabricated in accordance with the process steps illustrated in FIGS. 2 to 5, 8, and 9. The steps are demonstrated as follows.

First, on the (100) plane of an n-type InP substrate, an n-type $In_{0.57}Ga_{0.43}As$ etch stop layer, an n-type InP cladding layer (thickness: 2 μm), an i-type InP spacer layer (thickness: 300 nm), a semiconductor light-emitting layer having a quantum well structure with an emission wavelength of 1300 nm (130 nm in total), an i-type InP spacer layer (thickness: 300 nm), a p-type InP cladding layer (thickness: 1.2 μm), a p-type $In_{0.8}Ga_{0.20}As_{0.5}P_{0.5}$ cap layer (thickness: 50 nm), and a p-type $In_{0.57}Ga_{0.43}As$ contact layer (thickness: 100 nm) were sequentially formed by MOCVD. Note that in forming the semiconductor light-emitting layer having a quantum well structure, ten $In_{0.73}Ga_{0.27}As_{0.5}P_{0.5}$ well layers (thickness: 5 nm) and ten InP barrier layers (thickness: 8 nm) were alternately stacked.

Figure 12A:
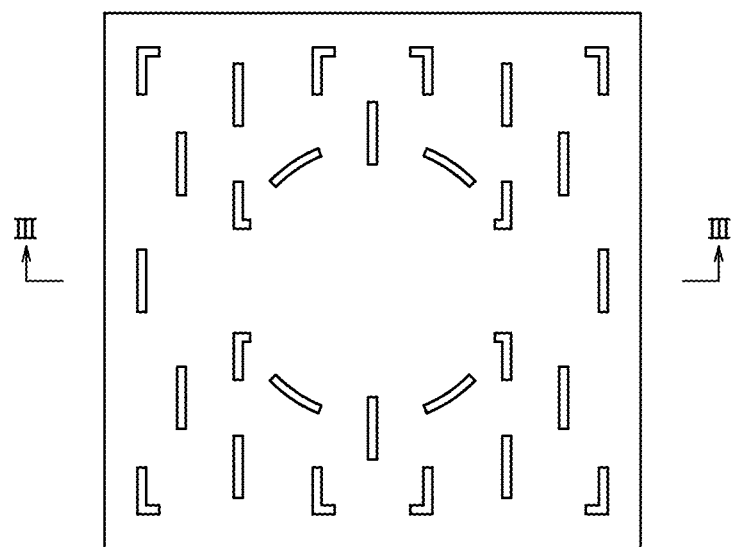
FIG. 12A is a schematic top view depicting a pattern of an ohmic electrode section in Examples.

On the p-type $In_{0.57}Ga_{0.43}As$ contact layer, a p-type ohmic electrode portion (Au/AuZn/Au, total thickness: 530 nm) was formed into islands distributed as illustrated in FIG. 12A. The plane section III-III of FIG. 12A corresponds to the schematic cross-sectional view of Step 3A in FIG. 3. When forming this pattern, a resist pattern was formed and an ohmic electrode was then vapor deposited, followed by lift-off of the resist pattern. When the semiconductor layer of the wafer in this state was observed in a top view using an optical microscope, the contact area ratio of the p-type ohmic electrode portion with respect to the semiconductor layer was 4.5%. Note that the outer size of the object depicted in FIG. 12A is 380 μm square.

Next, a resist mask was formed on and around the p-type ohmic electrode portion, and the p-type $In_{0.57}Ga_{0.43}As$ contact layer was removed, except for areas where the ohmic electrode portion was formed, by wet etching using tartaric acid-hydrogen peroxide mixture. After that, a dielectric layer (thickness: 700 nm) made of $SiO_2$ was formed on the entire surface of the p-type $In_{0.80}Ga_{0.20}As_{0.50}P_{0.50}$ cap layer by plasma CVD. A window pattern having a shape extending over 3 μm each in the width direction and the longitudinal direction in an area above the p-type ohmic electrode portion was formed using resist, and the dielectric layer on and around the p-type ohmic electrode portion was removed by wet etching using BHF to expose the p-type $In_{0.80}Ga_{0.20}As_{0.50}P_{0.50}$ cap layer. At this time, the height $H_1$ (700 nm) of the dielectric layer on the p-type $In_{0.80}Ga_{0.20}As_{0.50}P_{0.50}$ cap layer is larger than the height $H_2$ (630 nm) of the contact portion composed of the p-type contact layer (thickness: 130 nm) and the p-type ohmic electrode portion (thickness: 530 nm) by 70 nm. When the semiconductor layer of the wafer in this state was observed in a top view using an optical microscope, the contact area ratio of the dielectric layer ($SiO_2$) was 90%.

Next, a reflective metal layer (Al/Au/Pt/Au) was formed on the entire surface of the p-type $In_{0.80}Ga_{0.20}As_{0.50}P_{0.50}$ cap layer by vapor deposition. The thicknesses of the metal layers in the reflective metal layer were 10 nm, 650 nm, 100 nm, and 900 nm in this order.

On the other hand, a metal bonding layer (Ti/Pt/Au) was formed on a conductive Si substrate serving as a support substrate (thickness: 300 μm). The thicknesses of the metal layers in the metal bonding layer were 650 nm, 10 nm, and 900 nm in this order.

The reflective metal layer and the metal bonding layer were placed to face one another and were subjected to thermocompression bonding at 300° C. Further, the InP substrate was removed by wet etching using a hydrochloric acid diluent.

Next, following the flows depicted in FIGS. 8 and 9, surface roughening was carried out on the n-type InP cladding layer. Firstly, a positive photoresist PR1 was patterned (Step B in FIG. 8). As depicted in FIG. 13A, the pattern of the photoresist PR1 was such that the centers of the recesses were arranged two-dimensionally in an isosceles triangular lattice arrangement and the distance between the <011> orientation and the centers in the direction orthogonal to the <011> orientation was 6.6 μm. Further, each recess was formed into a regular hexagon (length of each side: 2 μm). Subsequently, the pattern was transferred to the n-type $In_{0.57}Ga_{0.43}As$ etch stop layer in an etchant solution of tartaric acid-hydrogen peroxide mixture (Step 8C in FIG. 8). Thereafter, the photoresist PR1 was rinsed and removed (Step 8D in FIG. 8), and another photoresist PR2 was provided on the upper surface of the electrode formation region in the n-type InP cladding layer (Step 9A in FIG. 9). Thereafter, the n-type InP cladding layer was etched in an etchant solution of hydrochloric acid-acetic acid mixture (hydrochloric acid:acetic acid=1:2) (Step 9B in FIG. 9), and the n-type $In_{0.57}Ga_{0.43}As$ etch stop layer was removed by wet etching in an etchant solution of sulfuric acid-hydrogen peroxide mixture (sulfuric acid:hydrogen peroxide:water=3:1:1) (Step 9C in FIG. 9).

Figure 12B:
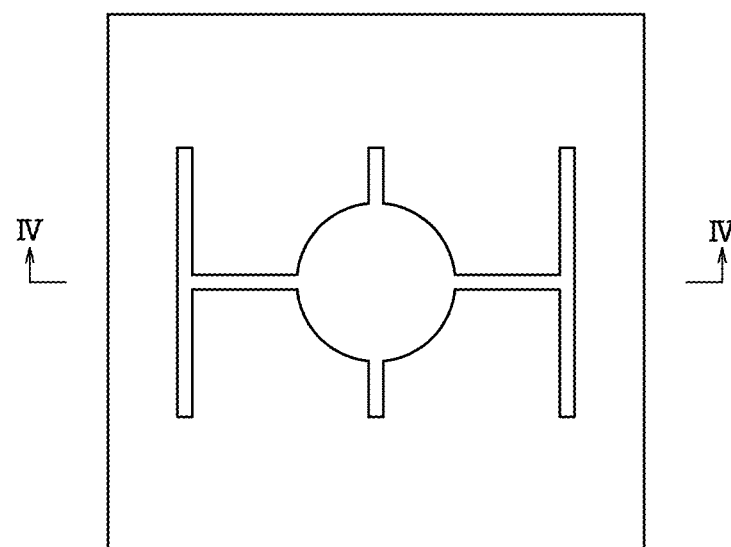
FIG. 12B is a schematic plan view depicting a pattern of a top electrode in Examples.

Next, on the n-type InP cladding layer, an n-type electrode (Au (thickness: 10 nm)/Ge (thickness: 33 nm)/Au (thickness: 57 nm)/Ni (thickness: 34 nm)/Au (thickness: 800 nm)/Ti (thickness: 100 nm)/Au (thickness: 1000 nm)) was formed as a wiring portion of a top electrode by resist pattern formation, vapor deposition of an n-type electrode, and lift-off of the resist pattern as illustrated in FIG. 12B. Further, a pad portion (Ti (thickness: 150 nm)/Pt (thickness: 100 nm)/Au (thickness: 2500 nm)) was formed on the n-type electrode to obtain the top electrode having a pattern as illustrated in FIG. 12B. The plane section IV-IV of FIG. 12B corresponds to Step 4B in FIG. 6. Note that the outer size of the object depicted in FIG. 12B is 380 µm square as with FIG. 12A.

Finally, the semiconductor layers between devices (width: 60 µm) were removed by mesa etching to form dicing lines. A back electrode (Ti (thickness: 10 nm)/Pt (thickness: 50 nm)/Au (thickness: 200 nm)) was formed on the back surface of the Si substrate, and chip singulation was performed by dicing to obtain a semiconductor light-emitting device of Example 1. Note that the chip size was 350 µm×350 µm.

Example 2

A semiconductor light-emitting device of Example 2 was fabricated in the same manner as in Example 1 except that an emission wavelength of a semiconductor light-emitting layers having a quantum well structure was changed to 1460 nm, from the emission wavelength of 1300 nm of that in Example 1. Note that 10 layers of $In_{0.65}Ga_{0.35}As_{0.19}P_{0.81}$ well layer (thickness: 5 nm) and 10 layers of InP barrier layer (thickness: 8 nm) were alternately stacked as the semiconductor light-emitting layers having the quantum well structure in Example 2.

Comparative Example 1

A semiconductor light-emitting device of Comparative Example 1 was fabricated in the same manner as in Example 1 except that the surface of an n-type InP cladding layer equivalent to that in Example 1 was not roughened.

Comparative Example 2

A semiconductor light-emitting device of Comparative Example 2 was fabricated in the same manner as in Example 2 except that the surface of an n-type InP cladding layer equivalent to that of Example 2 was not roughened.

<Observations with SEM>

Figure 14A:
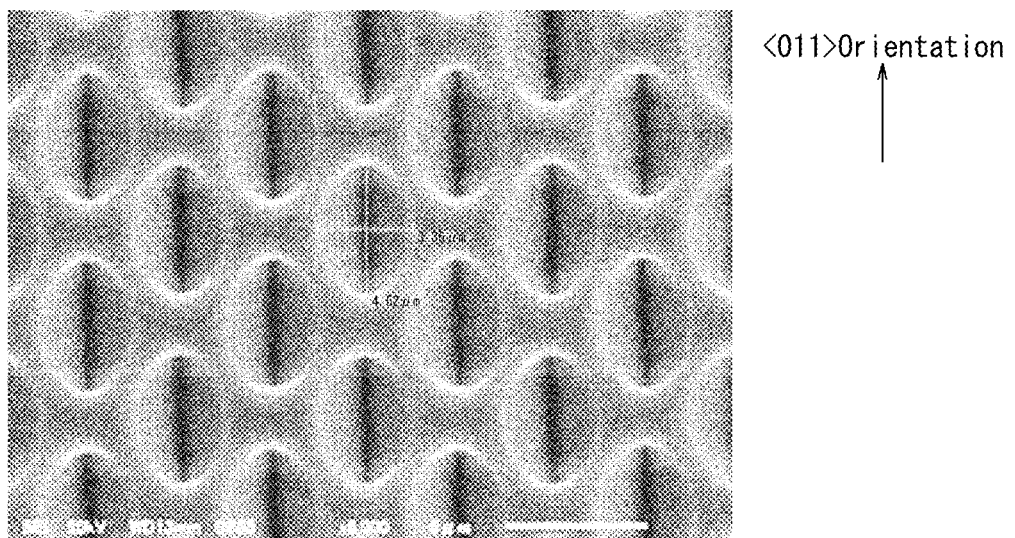
FIG. 14A is an SEM image of the semiconductor light-emitting device of Example 1 in top view.
Figure 14B:
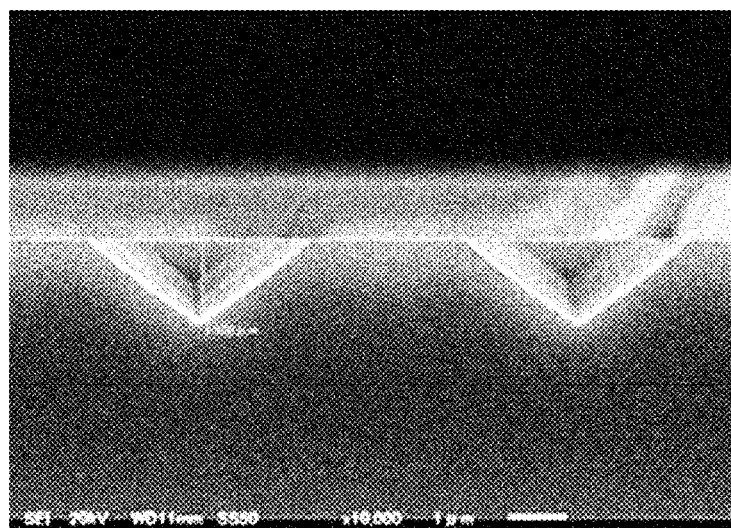
FIG. 14B is a cross-sectional SEM image of the semiconductor light-emitting device of Example 1.

As for Example 1, the surface of the n-type InP cladding layer was observed with a scanning electron microscope (SEM), and FIG. 14A depicts the SEM image. Moreover, FIG. 14B depicts a cross-sectional SEM image of FIG. 14A. Note that the vertical direction of the sheet of FIG. 14A is the <011> orientation, and FIG. 14B is a cross-sectional image in the direction orthogonal to the <011> orientation. A similar SEM image was observed in Example 2 although it is not illustrated. In contrast, it was confirmed that the surfaces of the n-type InP cladding layers were flat in SEM images of Comparative Examples 1 and 2.

It was confirmed from FIG. 14A that the recesses were formed in ellipses. It was also confirmed that long axes of the ellipses were oriented along the <011> orientation. It was also confirmed from the SEM image that, on the tilted surface in FIG. 14B, the angle between the {100} plane of the upper face and the tilted surface was 38° when observed from the {011} plane, which was an acute angle smaller than the angle with the {100} plane (54.7 degrees) when the tilted surface was the {111} plane.

<Evaluations of Emission Spectra>

Emission spectra of Examples 1 and 2 and Comparative Examples 1 and 2 were obtained. FIGS. 15A, 15B, 16A, and FIG. 16B depicts results of measurements of Example 1, Comparative Example 1, Example 2, and Comparative Example 2, respectively. Note that the locations of the local minima in each emission spectrum are indicated by arrows in FIGS. 15A, 15B, 16A, and FIG. 16B.

Figure 15A:
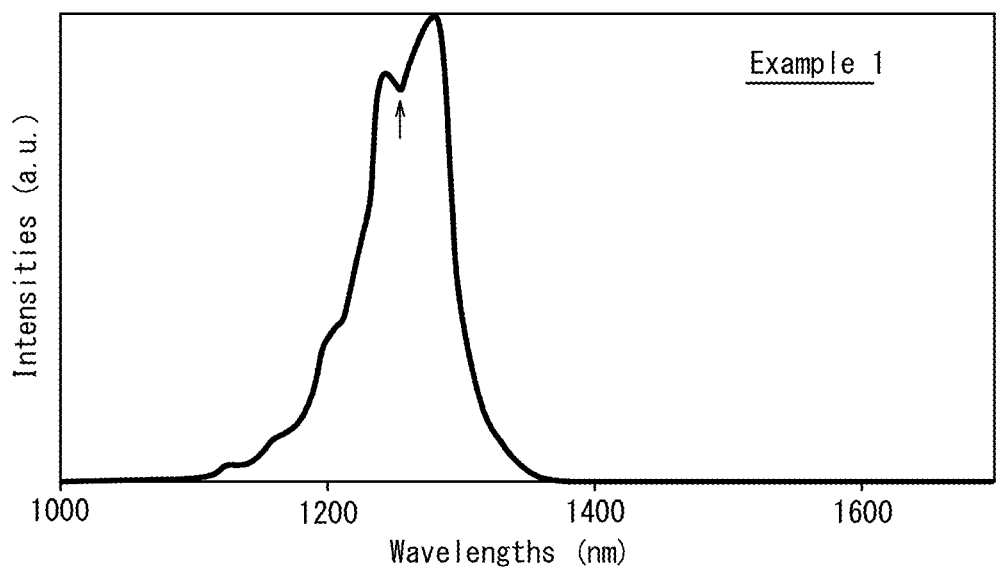
FIG. 15A is an emission spectrum of the semiconductor light-emitting device of Example 1.
Figure 15B:
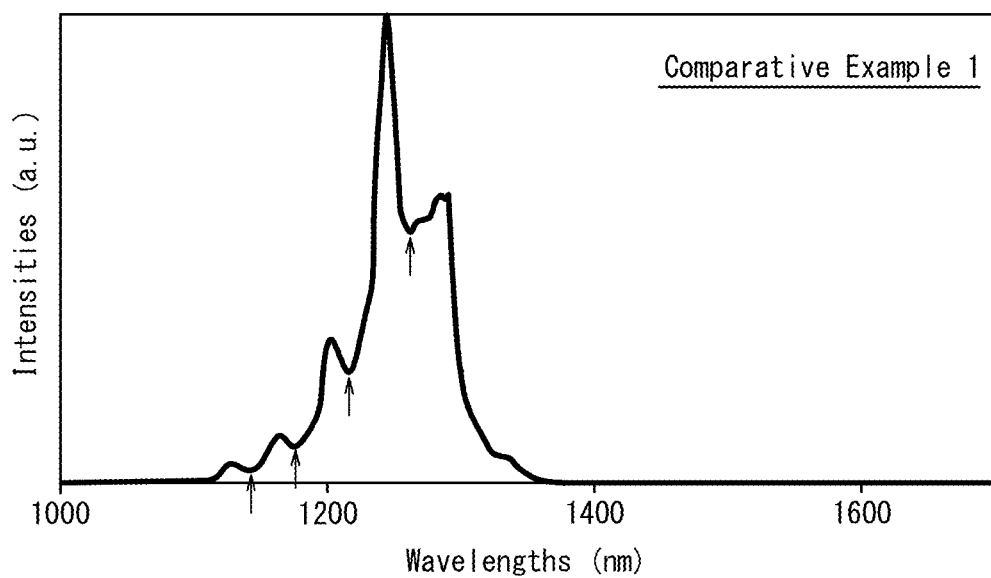
FIG. 15B is an emission spectrum of a semiconductor light-emitting device of Comparative Example 1.
Figure 16A:
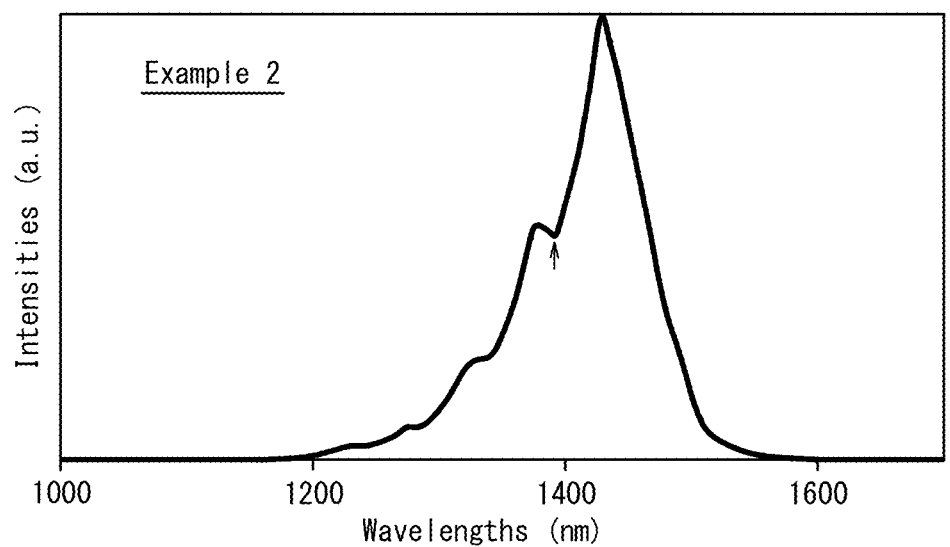
FIG. 16A is an emission spectrum of a semiconductor light-emitting device of Example 2.
Figure 16B:
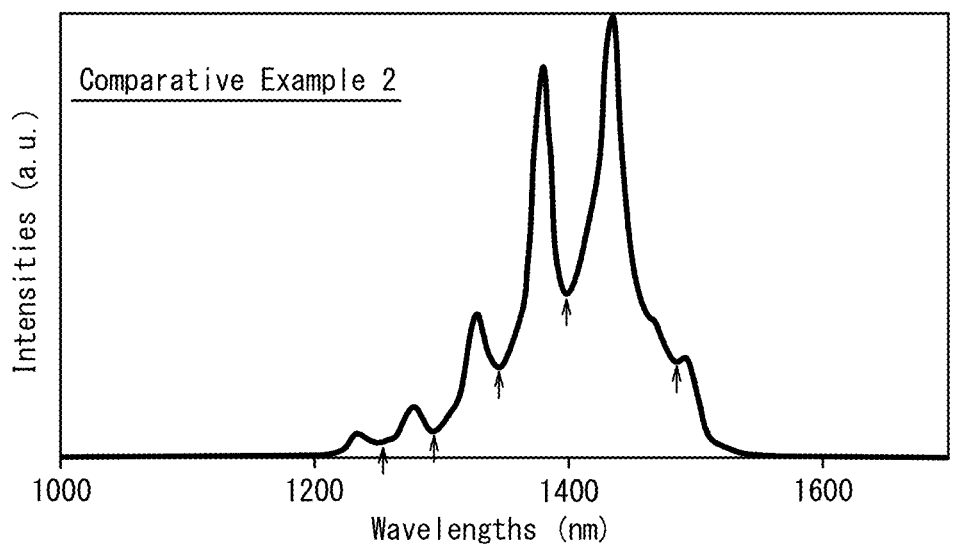
FIG. 16B is an emission spectrum of a semiconductor light-emitting device Comparative of Example 2.

Presence of a local minimum in an emission spectrum means a split wavelength spectrum and presence of multiple peaks. When comparing between FIG. 15A and FIG. 15B, Comparative Example 1 without being subjected to surface roughening had four local minima, whereas Example 1 subjected to the surface roughening had only a single local minimum. Moreover, when comparing between FIG. 16A and FIG. 16B, Comparative Example 2 without being subjected to surface roughening had five local minima, whereas Example 2 subjected to the surface roughening had only a single local minimum. It was confirmed from these results that the formation of the recesses in the n-type InP cladding layer by surface roughening mitigated multipeaks in the emission spectra.

Example 3

A semiconductor light-emitting device of Example 3 was fabricated in the same manner as in Example 1 except that the pattern of the photoresist PR1 was changed to a two-dimensional square lattice arrangement depicted in FIG. 13B, from the pattern in Example 1 where the centers of the recesses were arranged two-dimensionally in an equilateral triangular lattice arrangement as depicted in FIG. 13A, and that the distance between the <011> orientation and the centers in the direction orthogonal to the <011> orientation of the recess was changed to 8 µm. Note that the form of each recess in the photoresist PR1 was a regular hexagon having a length of each side of 2 µm as in Example 1.

<Observations with SEM>

Figure 17A:
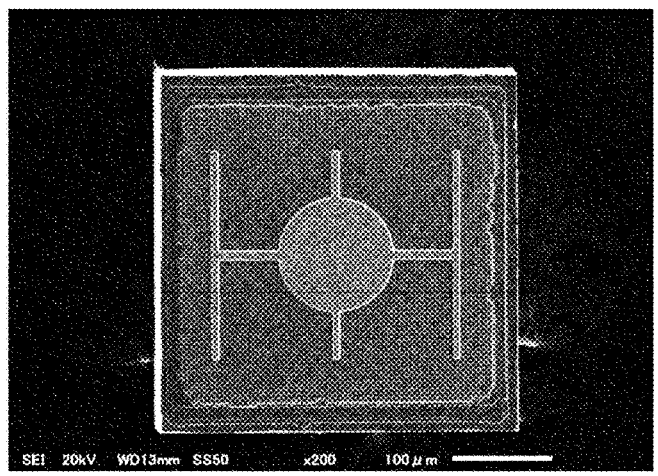
FIG. 17A is an SEM image of the semiconductor light-emitting device of Example 3 in top view.
Figure 17B:
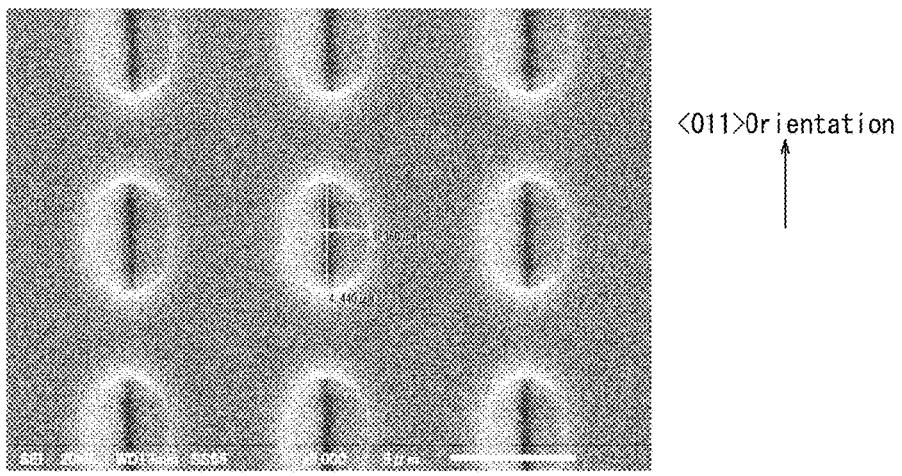
FIG. 17B is an enlarged image of FIG. 17A.
Figure 17C:
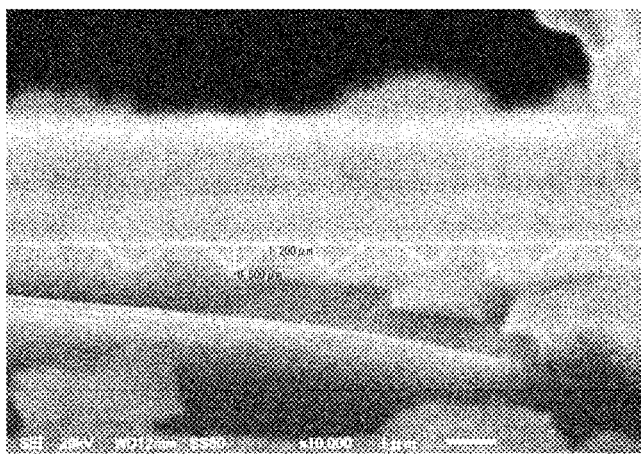
FIG. 17C is an enlarged cross-sectional image of FIG. 17A.

As for Example 3, the surface of the n-type InP cladding layer was observed with the scanning electron microscope (SEM), and FIG. 17A depicts the SEM image. Moreover, FIG. 17B depicts an enlarged image of FIG. 17A, and FIG. 17C depicts a cross-sectional SEM image of FIG. 17A. Note that the vertical direction of the sheet of FIG. 14B is the <011> orientation, and FIG. 14C is a cross-sectional image in the direction orthogonal to the <011> orientation.

It was confirmed from FIG. 17B that the recesses were formed in ellipses, and it was also confirmed that long axes of the ellipses were oriented along the <011> orientation.

<Evaluation of Emission Spectrum>

Figure 18:
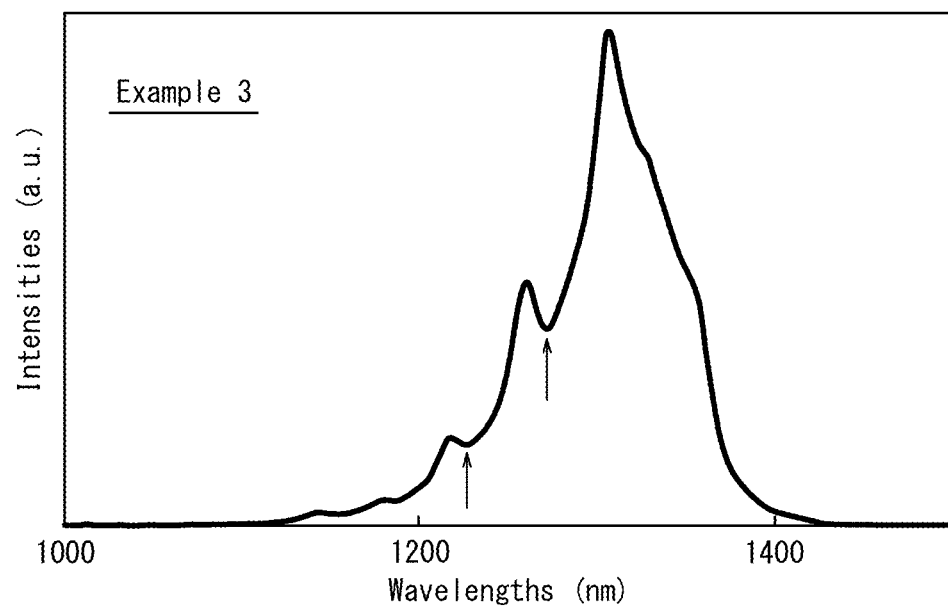
FIG. 18 is an emission spectrum of the semiconductor light-emitting device of Example 3.

Further, an emission spectrum of Example 3 was obtained in the similar manner as in Examples 1 and 2. FIG. 18 depicts the results. It was confirmed that there were two local minima in Example 3, and a multipeak was mitigated. Note that a comparison between emission spectra of Examples 1 and 3 indicated that Example 1 provided a greater effect on mitigating a multipeak.

INDUSTRIAL APPLICABILITY

In accordance with the present disclosure, a semiconductor light-emitting device is provided, which can mitigate a multipeak in an emission spectrum in a bonding-type semiconductor light-emitting device having an InP cladding layer.

REFERENCE SIGNS LIST

1: semiconductor light-emitting device
10: growth substrate
20: III-V compound semiconductor etch stop layer
30: semiconductor stack
31: n-type InP cladding layer
35: semiconductor light-emitting layer
35W: well layer 35B: barrier layer
37: p-type InP cladding layer
39: p-type cap layer
40: contact portion
41 (41a): p-type contact layer
43: ohmic metal portion
50: dielectric layer
60: metal reflective layer
70: metal bonding layer
80: conductive support substrate
100, 100': semiconductor light-emitting device
91: back electrode
93: top electrode
E1: exposed area
E2: exposed surface
E3: exposed portion

The invention claimed is:

1. A semiconductor light-emitting device comprising a first conductive type InP cladding layer, a semiconductor light-emitting layer, and a second conductive type InP cladding layer provided sequentially over a conductive support substrate, the second conductive type InP cladding layer being on a light extraction side, the semiconductor light-emitting device further comprising:
a metal reflective layer, between the conductive support substrate and the first conductive type InP cladding layer, for reflecting light emitted from the semiconductor light-emitting layer; and
a plurality of recesses provided in a surface of the second conductive type InP cladding layer,
wherein the semiconductor light device emits light with a wavelength of 1000 nm to 2200 nm in a near infrared region, and
wherein bottom of recesses are oriented along a <011> orientation.

2. The semiconductor light-emitting device according to claim 1, wherein the recesses are formed in ellipses in a plan view from the light extraction side, and long axes of the ellipses are oriented along the bottoms of the recesses.

3. The semiconductor light-emitting device according to claim 1, wherein widths of the recesses vary periodically along a direction of central axes of the recesses in a plan view from the light extraction side, and the direction of the central axes is oriented along the bottoms of the recesses.

4. The semiconductor light-emitting device according to claim 1, wherein the plurality of recesses are regularly arranged.

5. The semiconductor light-emitting device according to claim 1, wherein space between adjacent recesses on the surface of the second conductive type InP cladding layer is flat.

6. The semiconductor light-emitting device according to claim 2, wherein the long axes of the ellipses are oriented in parallel to the <011> orientation.

7. The semiconductor light-emitting device according to claim 3, wherein the direction of the central axes is oriented in parallel to the <011> orientation.

8. The semiconductor light-emitting device according to claim 4, wherein the plurality of recesses are arranged in a stripe pattern in which directions of central axes of the recesses are oriented in parallel to the <011> orientation.

9. The semiconductor light-emitting device according to claim 6, wherein the plurality of recesses are regularly arranged.

10. The semiconductor light-emitting device according to claim 7, wherein the plurality of recesses are regularly arranged.

11. The semiconductor light-emitting device according to claim 4, wherein the plurality of recesses are arranged in a pattern in which centers of the recesses in the pattern are arranged two-dimensionally in a triangular lattice arrangement.

12. The semiconductor light-emitting device according to claim 9, wherein the plurality of recesses are arranged in a pattern in which centers of the recesses in the pattern are arranged two-dimensionally in a triangular lattice arrangement.

13. The semiconductor light-emitting device according to claim 1, wherein
a dielectric layer and a contact portion are provided in parallel between the reflective metal layer and the first conductive type InP cladding layer, and
the contact portion includes an ohmic metal portion on the reflective metal layer and a contact layer on the ohmic metal portion.

14. A method of manufacturing a semiconductor light-emitting device emitting light with a wavelength of 1000 nm to 2200 nm in a near infrared region, comprising:
a semiconductor layer formation step of forming a III-V compound semiconductor etch stop layer containing In, Ga, and As, a second conductive type InP cladding layer, a semiconductor light-emitting layer, and a first conductive type InP cladding layer sequentially over a growth substrate;
a metal reflective layer formation step of forming a metal reflective layer on the first conductive type InP cladding layer for reflecting light emitted from the semiconductor light-emitting layer;
a bonding step of bonding a conductive support substrate having a surface provided with a metal bonding layer to the metal reflective layer having the metal bonding layer interposed therebetween;
a substrate removal step of removing the growth substrate; and
a surface roughening step of forming a plurality of recesses in a surface of the second conductive type InP cladding layer, after the substrate removal step,
wherein bottoms of the recesses are made to be oriented along a <011> orientation in the surface roughening step.

15. The method of manufacturing a semiconductor light-emitting device according to claim 14, wherein the surface roughening step comprises:
a first step of etching the III-V compound semiconductor etch stop layer for patterning the same; and
a second step of etching a surface of the second conductive type InP cladding layer using the patterned III-V compound semiconductor etch stop layer as a mask.

* * * * *